(12) United States Patent
Blakely et al.

(10) Patent No.: US 11,101,248 B2
(45) Date of Patent: Aug. 24, 2021

(54) LIGHT EMITTING DIODES, COMPONENTS AND RELATED METHODS

(71) Applicant: Cree, Inc., Durham, NC (US)

(72) Inventors: Colin Kelly Blakely, Franklinton, NC (US); Jasper Sicat Cabalu, Apex, NC (US); Kyle Damborsky, Morrisville, NC (US)

(73) Assignee: CreeLED, Inc., Newark, CA (US)

( * ) Notice: Subject to any disclaimer, the term of this patent is extended or adjusted under 35 U.S.C. 154(b) by 0 days.

(21) Appl. No.: 15/681,205

(22) Filed: Aug. 18, 2017

(65) Prior Publication Data

US 2019/0057954 A1   Feb. 21, 2019

(51) Int. Cl.
*H01L 25/075* (2006.01)
*H01L 33/50* (2010.01)
(Continued)

(52) U.S. Cl.
CPC ...... *H01L 25/0753* (2013.01); *H01L 27/0248* (2013.01); *H01L 33/507* (2013.01); *H01L 33/54* (2013.01); *H01L 33/58* (2013.01); *H01L 33/62* (2013.01); *H01L 33/486* (2013.01); *H01L 33/60* (2013.01); *H01L 2933/005* (2013.01); *H01L 2933/0041* (2013.01); *H01L 2933/0058* (2013.01); *H01L 2933/0066* (2013.01); *H01L 2933/0091* (2013.01); *H05B 45/20* (2020.01)

(58) Field of Classification Search
CPC ... H01L 25/0753; H01L 33/486; H01L 33/54; H01L 33/58; H01L 33/60; H01L 33/62; H01L 33/507
See application file for complete search history.

(56) References Cited

U.S. PATENT DOCUMENTS

| 4,918,497 A | 4/1990 | Edmond |
| 4,966,862 A | 10/1990 | Edmond |

(Continued)

FOREIGN PATENT DOCUMENTS

| CN | 111213236 A | 5/2020 |
| WO | WO 2013/070696 A1 | 5/2013 |

(Continued)

OTHER PUBLICATIONS

Report from the International Searching Authority for Application No. PCT/US2018/046838 dated Mar. 27, 2019.

(Continued)

*Primary Examiner* — Tuan A Hoang
(74) *Attorney, Agent, or Firm* — Jenkins, Wilson, Taylor & Hunt, P.A.

(57) ABSTRACT

A light emitter device includes a submount with a top surface and a bottom surface, electrically conductive traces on the top surface of the submount, light emitting diodes (LEDs) arranged on the top surface of the submount in light emitter zones, with the LEDs being electrically connected to respective traces of the traces, a retention material disposed over the top surface of the submount in a form of walls which physically separate the light emitter zones, and encapsulants that are dispensed in respective light emitter zones of the light emitter zones. The LEDs are individually addressable to independently control an output of light from each of the LEDs to produce a specified light output.

34 Claims, 15 Drawing Sheets

(51) Int. Cl.
  *H01L 33/54* (2010.01)
  *H01L 33/58* (2010.01)
  *H01L 27/02* (2006.01)
  *H01L 33/62* (2010.01)
  *H01L 33/48* (2010.01)
  *H01L 33/60* (2010.01)
  *H05B 45/20* (2020.01)

(56) References Cited

U.S. PATENT DOCUMENTS

| | | | |
|---|---|---|---|
| 5,027,168 A | 6/1991 | Edmond | |
| 5,210,051 A | 5/1993 | Carter, Jr. | |
| 5,338,944 A | 8/1994 | Edmond et al. | |
| 5,359,345 A | 10/1994 | Hunter | |
| 5,393,993 A | 2/1995 | Edmond et al. | |
| 5,416,342 A | 5/1995 | Edmond et al. | |
| 5,523,589 A | 6/1996 | Edmond et al. | |
| 5,604,135 A | 2/1997 | Edmond et al. | |
| 5,631,190 A | 5/1997 | Negley | |
| 5,739,554 A | 4/1998 | Edmond et al. | |
| 5,912,477 A | 6/1999 | Negley | |
| 6,120,600 A | 9/2000 | Edmond et al. | |
| 6,187,606 B1 | 2/2001 | Edmond et al. | |
| 6,201,262 B1 | 3/2001 | Edmond et al. | |
| 6,600,175 B1 | 7/2003 | Baretz et al. | |
| 6,791,119 B2 | 9/2004 | Slater et al. | |
| 6,849,308 B1* | 2/2005 | Speakman | G03F 7/16 427/422 |
| 6,853,010 B2 | 2/2005 | Slater et al. | |
| 6,958,497 B2 | 10/2005 | Emerson et al. | |
| 7,095,056 B2 | 8/2006 | Vitta et al. | |
| 7,213,940 B1* | 5/2007 | Van De Ven | H05B 33/0803 257/89 |
| 7,456,499 B2 | 11/2008 | Loh et al. | |
| 7,564,180 B2 | 7/2009 | Brandes | |
| 7,655,957 B2 | 2/2010 | Loh et al. | |
| 7,802,901 B2 | 9/2010 | McMillan | |
| 7,821,023 B2 | 10/2010 | Yuan et al. | |
| 7,952,544 B2 | 5/2011 | Roberts | |
| 7,960,819 B2 | 6/2011 | Loh et al. | |
| 7,999,283 B2 | 8/2011 | Chakraborty et al. | |
| 8,018,135 B2 | 9/2011 | Van De Ven et al. | |
| 8,044,418 B2 | 10/2011 | Loh et al. | |
| 8,125,137 B2 | 2/2012 | Medendorp, Jr. et al. | |
| 8,264,138 B2 | 9/2012 | Negley et al. | |
| 8,337,071 B2 | 12/2012 | Negley et al. | |
| 8,410,679 B2 | 4/2013 | Ibbetson et al. | |
| 8,425,271 B2 | 4/2013 | Hussell et al. | |
| 8,563,339 B2 | 10/2013 | Tarsa et al. | |
| 8,575,639 B2* | 11/2013 | Hussell | H01L 25/0753 257/100 |
| 8,729,589 B2* | 5/2014 | Hussell | F21V 15/01 257/98 |
| 8,759,847 B2* | 6/2014 | Xu | H01L 25/0753 257/40 |
| 8,970,131 B2 | 3/2015 | Brandes et al. | |
| 9,024,349 B2 | 5/2015 | Chitnis et al. | |
| 9,070,850 B2* | 6/2015 | Keller | H01L 33/486 |
| 9,131,561 B2 | 9/2015 | Athalye | |
| 9,159,888 B2 | 10/2015 | Chitnis et al. | |
| 9,277,605 B2 | 3/2016 | Ni | |
| 9,414,454 B2 | 8/2016 | Brandes et al. | |
| 9,713,211 B2 | 7/2017 | Van De Ven et al. | |
| 9,793,247 B2 | 10/2017 | Yuan et al. | |
| 2005/0029927 A1* | 2/2005 | Setlur | C09K 11/7734 313/501 |
| 2006/0186431 A1* | 8/2006 | Miki | H01L 33/505 257/100 |
| 2006/0221272 A1 | 10/2006 | Negley et al. | |
| 2006/0245188 A1 | 11/2006 | Takenaka | |
| 2007/0104828 A1 | 5/2007 | Fornaguera | |
| 2008/0211416 A1* | 9/2008 | Negley | H05B 33/0803 315/193 |
| 2009/0050908 A1* | 2/2009 | Yuan | F21K 9/00 257/88 |
| 2009/0202793 A1* | 8/2009 | Tanaka | C08G 73/1025 428/195.1 |
| 2011/0116252 A1 | 5/2011 | Agatani et al. | |
| 2012/0286669 A1* | 11/2012 | Yan | H05B 33/086 315/151 |
| 2014/0061689 A1* | 3/2014 | Seibel | H01L 25/0753 257/89 |
| 2014/0197431 A1* | 7/2014 | Oka | H01L 25/0753 257/88 |
| 2014/0340890 A1 | 11/2014 | Hata et al. | |
| 2015/0076534 A1* | 3/2015 | Terakami | H01L 25/0753 257/89 |
| 2015/0257211 A1 | 9/2015 | Johnson et al. | |
| 2016/0149104 A1* | 5/2016 | Bergmann | H01L 33/62 257/88 |
| 2017/0194297 A1* | 7/2017 | Kuriki | H01L 27/156 |
| 2017/0211761 A1* | 7/2017 | Kuriki | F21V 29/89 |
| 2018/0052275 A1* | 2/2018 | Lee | H01L 33/62 |
| 2019/0058003 A1 | 2/2019 | Blakely et al. | |

FOREIGN PATENT DOCUMENTS

| | | |
|---|---|---|
| WO | WO 2017/015129 A1 | 1/2017 |
| WO | WO 2019/036560 A2 | 2/2019 |

OTHER PUBLICATIONS

International Search Report and Written Opinion for Application No. PCT/US2018/046838 dated May 23, 2019.
Restriction Requirement for U.S. Appl. No. 15/912,155 dated Nov. 21, 2019.
Non-Final Office Action for U.S. Appl. No. 15/912,155 dated Mar. 18, 2020.
Advisory Action for U.S. Appl. No. 15/912,155 dated Oct. 30, 2020.
Final Office Action for U.S. Appl. No. 15/912,155 dated Aug. 13, 2020.
Non-Final Office Action for U.S. Appl. No. 15/912,155 dated Nov. 25, 2020.
European Office Action for Application No. 18769534.1 dated Mar. 24, 2021.
Final Office Action for U.S. Appl. No. 15/912,155 dated Mar. 30, 2021.

* cited by examiner

FIG. 5A  FIG. 5B

LIGHT EMITTING DIODES, COMPONENTS AND RELATED METHODS

TECHNICAL FIELD

The subject matter disclosed herein relates generally to light emitting diodes (LEDs), components, and related methods. More particularly, the subject matter disclosed herein relates to devices, components, systems and methods utilizing individually addressable strings of light emitting components to provide a multiplicity of emission patterns and improve lighting performance.

BACKGROUND

Light emitting diodes ("LEDs") are solid state devices that convert electrical energy into light. LEDs can be implemented in light emitter devices or components for providing different colors and patterns of light, which is useful in various lighting and optoelectronic applications. Light emitter devices can include LEDs that are configured as surface mount devices (SMDs), which can be mounted directly onto the surface of an underlying circuit component or heat sink, such as a printed circuit board (PCB) or metal core printed circuit board (MCPCB), which can collectively be referred to as a "submount." SMDs can have bottom electrical contacts or leads that directly mount to the underlying circuit component. SMDs can be used in various LED light bulb and light fixture applications, and are rapidly being adopted as replacement devices for incandescent, fluorescent, and metal halide high-intensity discharge (HID) lighting applications.

Additionally, there exists a need for customizable and compact light emitter devices, which are capable of providing varying degrees of light intensity, light patterns, light colors, and the like. Because of their inherent design limitations, it is impossible to achieve satisfactory performance from conventionally known lighting devices, whether using incandescent, fluorescent, or metal halide HID lighting technology.

SUMMARY

Surface mountable (SMD) chip-on-board (COB) LEDs, components, and related methods having improved light output characteristics are provided hereinbelow. Devices, components, and methods described herein can advantageously provide a varied lighting pattern, lighting intensity, and light color output. Devices, components, and related methods described herein can be well suited for a variety of applications, such as personal, industrial, and commercial lighting applications, including, for example, in light bulbs and light fixture products and/or applications.

Solid state lighting apparatuses, such as LEDs, systems, and related methods are provided. An example apparatus can comprise, for example: a submount; one or more LEDs, and a reflective material (also referred to as a white wall). LED devices and components disclosed herein can have a beam angle of a light output that is substantially reduced to thereby improve light emission and output characteristics.

These and other objects of the present disclosure as can become apparent from the disclosure herein are achieved, at least in whole or in part, by the subject matter disclosed herein.

BRIEF DESCRIPTION OF DRAWINGS

A full and enabling disclosure of the present subject matter is set forth more particularly in the remainder of the specification, including reference to the accompanying figures, relating to one or more embodiments, in which:

FIGS. 5A and 5B are external top and side views of a light emitter device according to one embodiment, with an encapsulant material disposed between the walls formed by the retention material, in accordance with the disclosure herein;

DETAILED DESCRIPTION

Figure 1:
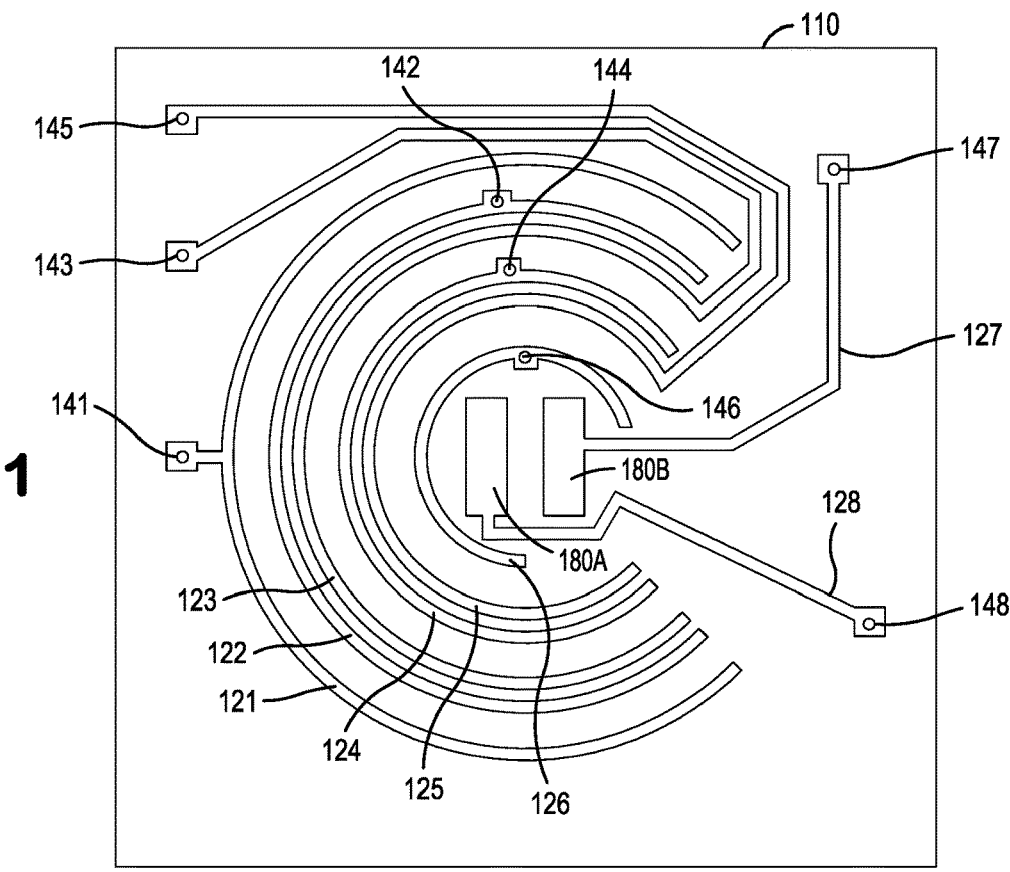
FIG. 1 is a top internal view of a submount for a light emitter device showing a plurality of conductive traces formed thereon, according to an embodiment disclosed herein.

In some aspects, solid state lighting apparatuses, LED devices and/or systems, and methods for producing the same, described herein can comprise various solid state light emitter electrical configurations, color combinations, and/or circuitry components for providing solid state lighting apparatuses having improved efficiency, improved emission profiles, enhanced output and/or optimized color production. Apparatuses and methods such as those disclosed herein advantageously cost less, are more efficient, vivid, uniform, and/or brighter than some other solutions.

Unless otherwise defined, terms used herein should be construed to have the same meaning as commonly understood by one of ordinary skill in the art to which this subject matter belongs. It will be further understood that terms used herein should be interpreted as having a meaning that is consistent with the respective meaning in the context of this specification and the relevant art, and should not be interpreted in an idealized or overly formal sense unless expressly so defined herein.

Aspects of the subject matter are described herein with reference to sectional, perspective, elevation, and/or plan view illustrations that are schematic illustrations of idealized aspects of the subject matter. Variations from the shapes of the illustrations as a result, for example, of manufacturing techniques and/or tolerances, are to be expected, such that aspects of the subject matter should not be construed as limited to particular shapes illustrated herein. This subject matter can be embodied in different forms and should not be construed as limited to the specific aspects or embodiments set forth herein. In the drawings, the size and relative sizes of layers and regions can be exaggerated for clarity.

Unless the absence of one or more elements is specifically recited, the terms "comprising", "including", and "having" as used herein should be interpreted as open-ended terms that do not preclude the presence of one or more elements. Like numbers refer to like elements throughout this description.

It will be understood that when an element such as a layer, region, or substrate is referred to as being "on" another element, it can be directly on the other element or intervening elements can be present. Moreover, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the apparatus in addition to the orientation depicted in the figures. For example, if the apparatus in the figures is turned over, structure or portion described as "above" other structures or portions would now be oriented "below" the other structures or portions.

The terms "electrically activated emitter(s)" and "emitter(s)" as used herein are synonymous terms and refer to any device capable of producing visible or near visible (e.g., from infrared to ultraviolet) wavelength radiation, including, for example, but not limited to, xenon lamps, mercury lamps, sodium lamps, incandescent lamps, and solid state emitters, including LEDs or LED chips, organic light emitting diodes (OLEDs), and lasers.

The terms "solid state light emitter(s)", "solid state emitter(s)", and "light emitter(s)" are synonymous terms and refer to a LED chip, a laser diode, an organic LED chip, and/or any other semiconductor device preferably arranged as a semiconductor chip that comprises one or more semiconductor layers, which can comprise silicon, silicon carbide, gallium nitride and/or other semiconductor materials, a substrate which can comprise sapphire, silicon, silicon carbide and/or other microelectronic substrates, and one or more contact layers which can comprise metal and/or other conductive materials.

The terms "groups", "segments", "strings", and "sets" as used herein are synonymous terms. As used herein, these terms generally describe how multiple LEDs are electrically connected, such as in series, in parallel, in mixed series/parallel, in common anode, or in common anode configurations among mutually exclusive groups/segments/sets. The segments of LEDs can be configured in a number of different ways and may have circuits of varying functionality associated therewith (e.g., driver circuits, rectifying circuits, current limiting circuits, shunts, bypass circuits, etc.), as discussed, for example, in commonly assigned and co-pending U.S. patent application Ser. No. 12/566,195, filed on Sep. 24, 2009, U.S. patent application Ser. No. 13/769,273, filed on Feb. 15, 2013, U.S. patent application Ser. No. 13/769,277 filed on Feb. 15, 2013, U.S. patent application Ser. No. 13/235,103, filed on Sep. 16, 2011, U.S. patent application Ser. No. 13/235,127, filed on Sep. 16, 2011, and U.S. Pat. No. 8,729,589, which issued on May 20, 2014, the disclosure of each of which is hereby incorporated by reference herein in the entirety.

The term "targeted" refers to configurations of LED chip segments that are configured to provide a pre-defined lighting characteristic that is a specified parameter for the lighting apparatus. For example, the targeted spectral power distribution can describe the characteristic of the light that is generated at a particular power, current, or voltage level.

Apparatuses, systems, and methods as disclosed herein can utilize red chips, green chips, and blue chips. Apparatuses, systems, and methods herein can utilize, for example, ultraviolet (UV) chips, cyan chips, blue chips, green chips, red chips, amber chips, and/or infrared chips.

The term "substrate" or "submount" as used herein in connection with lighting apparatuses refers to a mounting member or element on which, in which, or over which, multiple solid state light emitters (e.g., LEDs) can be arranged, supported, and/or mounted. A substrate can be, e.g., a component substrate, a chip substrate (e.g., a LED substrate), or a sub-panel substrate. Exemplary substrates useful with lighting apparatuses as described herein can, for example, comprise printed circuit boards (PCBs) and/or related components (e.g., including but not limited to metal core printed circuit boards (MCPCBs), flexible circuit boards, dielectric laminates, ceramic based substrates, and the like), ceramic boards having FR4 and/or electrical traces arranged on one or multiple surfaces thereof, high reflectivity ceramics (e.g., alumina) support panels, and/or mounting elements of various materials and conformations arranged to receive, support, and/or conduct electrical power to solid state emitters. Electrical traces described herein provide electrical power to the emitters for electrically activating and illuminating the emitters. Electrical traces may be visible and/or covered via a reflective covering, such as a solder mask material, Ag, or other suitable reflector.

In some embodiments, one substrate can be used to support multiple groups of solid state light emitters in addition to at least some other circuits and/or circuit elements, such as a power or current driving components and/or current switching components. In other aspects, two or more substrates (e.g., at least a primary substrate and one or more secondary substrate or substrates) can be used to support multiple groups of solid state light emitters in addition to at least some other circuits and/or circuit elements, such as a power or current driving components and/or temperature compensation components. The first and second (e.g., primary and secondary) substrates can be disposed above and/or below each other and along different planes, adjacent (e.g., side-by-side) to each other, have one or more co-planar surfaces disposed adjacent each other, arranged vertically, arranged horizontally, and/or arranged in any other orientation with respect to each other.

Solid state lighting apparatuses according to aspects of the subject matter herein can comprise III-V nitride (e.g., gallium nitride) based LEDs or laser chips fabricated on a silicon, silicon carbide, sapphire, or III-V nitride growth substrate, including (for example) LEDs manufactured and sold by Cree, Inc. of Durham, N.C. Such LEDs and/or lasers can be configured to operate such that light emission occurs through the substrate in a so-called "flip chip" orientation. Such LED and/or laser chips can also be devoid of growth substrates (e.g., following growth substrate removal). In some cases, LEDs can comprise red—III-V chips, but not nitride such as InGaAlP, GaAsP, and the like.

LEDs useable with lighting apparatuses as disclosed herein can comprise horizontal structures (with both electrical contacts on a same side of the LED chip) and/or vertical structures (with electrical contacts on opposite sides of the LED chip). A horizontally structured chip (with or without the growth substrate), for example, can be flip chip bonded (e.g., using solder) to a carrier substrate or printed circuit board (PCB), or wire bonded. A vertically structured chip (without or without the growth substrate) can have a first terminal solder bonded to a carrier substrate, mounting pad, or printed circuit board (PCB), and have a second terminal wire bonded to the carrier substrate, electrical element, or PCB.

Electrically activated light emitters, such as solid state emitters, can be used individually or in groups to emit light to stimulate emissions of one or more lumiphoric materials (e.g., phosphors, scintillators, lumiphoric inks, quantum dots), and generate light at one or more peak wavelengths, or of at least one desired perceived color (including combinations of colors that can be perceived as white). Inclusion of lumiphoric (also called 'luminescent') materials in lighting apparatuses as described herein can be accomplished by an application of a direct coating of the material on lumiphor support elements or lumiphor support surfaces (e.g., by powder coating, inkjet printing, or the like), adding such materials to lenses, and/or by embedding or dispersing such materials within lumiphor support elements or surfaces. Methods for fabricating LEDs having a planarized coating of phosphor integrated therewith are discussed by way of example in U.S. Patent Application Publication No. 2008/0179611, filed on Sep. 7, 2007, to Chitnis et al., the disclosure of which is hereby incorporated by reference herein in the entirety.

Other materials, such as light scattering elements (e.g., particles) and/or index matching materials can be associated with a lumiphoric material-containing element or surface. Apparatuses and methods as disclosed herein can comprise LEDs of different colors, one or more of which can be white emitting (e.g., including at least one LED with one or more lumiphoric materials).

In some aspects, one or more short wavelength solid state emitters (e.g., blue and/or cyan LEDs) can be used to stimulate emissions from a mixture of lumiphoric materials, or discrete layers of lumiphoric material, including red, yellow, and green lumiphoric materials. LEDs of different wavelengths can be present in the same group of solid state emitters, or can be provided in different groups of solid state emitters. A wide variety of wavelength conversion materials (e.g., luminescent materials, also known as lumiphors or lumiphoric media, e.g., as disclosed in U.S. Pat. No. 6,600,175, issued on Jul. 29, 2003, and U.S. Patent Application Publication No. 2009/0184616, filed on Oct. 9, 2008, each disclosure of which is hereby incorporated by reference herein in the entirety), are well-known and available to persons of skill in the art.

In some aspects, lighting apparatuses and systems as described herein comprise multiple sets of solid state light emitters targeting different colors (e.g., one set targeting a first color and at least a second set targeting a second color that is different than the first color). In some aspects, each set of the multiple sets comprises at least two solid state light emitters of a same color (e.g., the peak wavelengths coincide). In some aspects, each set of the multiple sets of solid state emitters is adapted to emit one or more different color(s) of light. In some aspects, each set of the multiple sets of solid state emitters is adapted to emit one or more color(s) of light that differ relative to one another (e.g., with each set of solid state emitters emitting at least one peak wavelength that is not emitted by another set of solid state emitters). Aspects of targeting and selectively activating sets of solid state emitters according to the present subject matter may be provided using the circuitry and/or techniques described in commonly assigned and co-pending U.S. patent application Ser. No. 14/221,839, the disclosure of which was previously incorporated hereinabove by reference.

The term "color" in reference to a solid state emitter refers to the color and/or wavelength of light that is emitted by the chip upon passage of electrical current therethrough.

Some embodiments of the present subject matter may use solid state emitters, emitter packages, fixtures, luminescent materials/elements, power supply elements, control elements, and/or methods such as described in U.S. Pat. Nos. 7,564,180; 7,456,499; 7,213,940; 7,095,056; 6,958,497; 6,853,010; 6,791,119; 6,600,175; 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862; and/or 4,918,497, and U.S. Pat. App. Pub. Nos. 2009/0184616; 2009/0080185; 2009/0050908; 2009/0050907; 2008/0308825; 2008/0198112; 2008/0179611; 2008/0173884; 2008/0121921; 2008/0012036; 2007/0253209; 2007/0223219; 2007/0170447; 2007/0158668; 2007/0139923; and/or 2006/0221272; U.S. patent application Ser. No. 11/556,440, filed on Dec. 4, 2006; with the disclosures of the foregoing patents, published patent applications, and patent application serial numbers being hereby incorporated by reference as if set forth fully herein.

The terms "lighting apparatus" and "module" as used herein are synonymous, and are not limited, except that it is capable of emitting light. That is, a lighting apparatus can be a device or apparatus that illuminates an area or volume, e.g., a structure, a swimming pool or spa, a room, a warehouse, an indicator, a road, a parking lot, a vehicle, signage (e.g., road signs, a billboard), a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, rope lights, ceiling fan lighting, archival/art display lighting, high vibration/impact lighting-work lights, etc., mirrors/vanity lighting, spotlighting, high-bay lighting, low-bay lighting, or any other light emitting device.

Phosphor and phosphor compounds as disclosed herein can comprise one or more of a wide variety of wavelength conversion materials or color conversion components including luminescent materials. Examples of luminescent materials (lumiphors) include phosphors, Cerium-doped Yttrium Aluminum Garnet (YAG) (e.g., LuAG:Ce), Nitrides, Oxy-Nitrides, scintillators, day glow tapes, nano-phosphors, quantum dots (e.g., such as provided by NNCrystal US Corp., Fayetteville, Arkansas), and inks that glow in the visible spectrum upon illumination with (e.g., ultraviolet) light. Inclusion of lumiphors in wavelength conversion components or related components as disclosed herein, in conjunction with solid state light emitters and LEDs, can be accomplished by providing layers (e.g., coatings) of such materials over solid state emitters and/or by dispersing luminescent materials to a clear encapsulant (e.g., epoxy-based or silicone-based curable resin or other polymeric matrix) arranged to cover one or more solid state light emitters. One or more luminescent materials useable in devices as described herein may be down-converting or up-converting, or can include a combination of both types.

Wavelength conversion materials can provide benefits including, for example, improved long term reliability (e.g., improved properties at around 1000 hours or more and 85° C., 105° C., and/or 125° C.), decreased bubbling around solid state light emitters, a larger viewing angle, lower dCCT color spread, cooler phosphor temperatures, brighter light emission, improved sulfur resistance, and/or a smaller color point spread, including all or any combination of such features.

The presently disclosed subject matter is directed to different embodiments of LED package structures having a light source that comprises LEDs. The LED packages can be arranged in different ways and are relatively small, while at the same time are efficient, reliable and cost effective. The embodiments according to the disclosure herein can have different shaped encapsulants and can emit with improved or similar efficiency compared to similar LED packages with fully hemispheric encapsulants. In some embodiments, where a plurality of LEDs are mounted on a substrate, the spacing between each LED chip can be controlled to optimize the intensity of light output from the LED package. The LED packages according to the disclosure herein can also be smaller and less expensive to manufacture.

The disclosure herein can, in some embodiments, be directed to a number of different features and arrangements that can improve or tailor the emission characteristics of LED packages and devices according to the disclosure herein. These can include, but are not limited to, improved luminal output and reduced beam angle of a light output from the LED devices. Such devices also can have improved efficiency and reliability, as well as higher outputs. In some embodiments, the use of some or all of these features can result in LED packages emitting light at improved lumen density.

The disclosure herein is described herein with reference to certain embodiments, but it is understood that the disclosure herein can be embodied in many different forms and should not be construed as limited to the embodiments set forth herein. In particular, the disclosure herein is described below in regards to certain LED packages having LEDs in different configurations, but it is understood that the disclosure herein can be used for many other LED packages with other LED configurations. The LED packages can also have many different shapes beyond those described below, such as rectangular, and the solder pads and attach pads can be arranged in many different ways. In other embodiments, the emission intensity of the different types of LEDs can be controlled to vary the overall LED package emission.

The embodiments described herein are with reference to a LED or LEDs, but in accordance with the disclosure herein and, in some aspects, LEDs as used herein can include LED chips, dies or any other suitable structure or structures. For example, LEDs as used herein can be individual junctions of a monolithic LED. For example, instead of being completely separate LED chips, the LEDs can each be a LED region all on a common substrate that can have different types of monolithic junctions. A mesa between the LEDs and on the common substrate can extend to certain layers or can extend all the way to or from the common substrate. Therefore, a monolithic LED can comprise more than one LED junctions on a common substrate, and the gaps between the LEDs can be formed by the mesas that can at least partially separate the LEDs.

The components described herein can have different shapes and sizes beyond those shown, and one or different numbers of LEDs can be included. It is also understood that the embodiments described below utilize co-planar light sources, but it is understood that non co-planar light sources can also be used. It is also understood that a LED light source may be comprised of multiple LEDs that may have different emission wavelengths. As mentioned above, in some embodiments, at least some of the LEDs can comprise blue emitting LEDs covered with a yellow phosphor along with red emitting LEDs, resulting in a white light emission from the LED package. In multiple LED packages, the LEDs can be serially interconnected or can be interconnected in different serial and parallel combinations.

It is also understood that, when an feature or element, such as a layer, region, encapsulant or submount may be referred to as being "on" another element, such feature or element can be directly on the other element, or other intervening elements may also be present. Furthermore, relative terms such as "inner", "outer", "upper", "above", "lower", "beneath", and "below", and similar terms, may be used herein to describe a relationship of one layer or another region to another. It is understood that these terms are intended to encompass different orientations of the device in addition to the orientation depicted in the figures.

The terms "electrically activated emitter(s)" and "emitter(s)" as used herein are synonymous terms and refer to any device capable of producing visible or near visible (e.g., from infrared to ultraviolet) wavelength radiation, including, for example, but not limited to, xenon lamps, mercury lamps, sodium lamps, incandescent lamps, and solid state emitters, including LEDs or LED chips, organic light emitting diodes (OLEDs), and lasers.

The terms "solid state light emitter(s)", "solid state emitter(s)", and "light emitter(s)" are synonymous terms and refer to an LED chip, a laser diode, an organic LED chip, and/or any other semiconductor device preferably arranged as a semiconductor chip that comprises one or more semiconductor layers, which can comprise silicon, silicon carbide, gallium nitride and/or other semiconductor materials, a substrate which can comprise sapphire, silicon, silicon carbide and/or other microelectronic substrates, and one or more contact layers which can comprise metal and/or other conductive materials.

The terms "groups", "segments", "strings", and "sets" as used herein are synonymous terms. As used herein, these terms generally describe how multiple LED chips are electrically connected, such as in series, in parallel, in mixed series/parallel, in common anode, or in common anode configurations among mutually exclusive groups/segments/sets. The segments of LED chips can be configured in a number of different ways and may have circuits of varying functionality associated therewith (e.g., driver circuits, rectifying circuits, current limiting circuits, shunts, bypass circuits, etc.), as discussed, for example, in commonly assigned U.S. patent application Ser. No. 12/566,195, filed on Sep. 24, 2009, U.S. patent application Ser. No. 13/769,273, filed on Feb. 15, 2013, U.S. patent application Ser. No. 13/769,277 filed on Feb. 15, 2013, U.S. patent application Ser. No. 13/235,103, filed on Sep. 16, 2011, U.S. patent application Ser. No. 13/235,127, filed on Sep. 16, 2011, and U.S. Pat. No. 8,729,589, which issued on May 20, 2014, the disclosure of each of which is hereby incorporated by reference herein in the entirety.

The term "targeted" refers to configurations of LED chip segments that are configured to provide a pre-defined lighting characteristic that is a specified parameter for the lighting apparatus. For example, the targeted spectral power distribution can describe the characteristic of the light that is generated at a particular power, current, or voltage level.

Wavelength conversion materials, including those incorporated into wavelength conversion components as disclosed herein, can provide benefits including, for example, improved long term reliability (e.g., improved properties at around 1000 hours or more and 85° C., 105° C., and/or 125° C.), decreased bubbling around solid state light emitters, a larger viewing angle, lower dCCT color spread, cooler phosphor temperatures, brighter light emission, improved sulfur resistance, and/or a smaller color point spread, including all or any combination of such features.

As described herein, one or more LED chips can be at least partially covered with a wavelength conversion component comprising one or more phosphors and/or one or more layers of phosphors on a clear substrate, such as, for example, sapphire. In some embodiments, such wavelength conversion components can be referred to as a phosphor-sapphire hat, or "Phos hat". Phosphors can be adapted to emit blue light, yellow light, green light, red light, or any combination(s) thereof upon being impinged with light emitted via one or more LED chips. That is, in some aspects, one or more phosphors in the Phos hat can absorb a portion of light emitted by the LED chip and in-turn reemit the absorbed light at a different wavelength such that the light emitter device or component emits a combination of light from each of the LED chip(s) and the phosphor(s). In one embodiment, the light emitter devices and components described herein can emit what is perceived as white light resulting from a combination of light emission from the LED chip and the Phos hat. In one embodiment according to the present subject matter, white emitting devices and components can consist of an LED chip that emits light in the blue wavelength spectrum and a phosphor in the Phos hat that absorbs some of the blue light and re-emits light in the green, yellow, and/or red wavelength spectrum. The devices and components can therefore emit a white light combination across the visible spectrum of light. In other embodiments, the LED chips with a wavelength conversion component, e.g., a Phos hat, can emit a non-white light combination of blue and yellow light as described in U.S. Pat. No. 7,213,940. LED chips emitting red light or LED chips covered by a phosphor of a Phos hat that absorbs LED light and emits a red light are also contemplated herein.

Wavelength conversion components or Phos hats used in some embodiments, with the disclosed LED components and devices can be made or assembled in any suitable manner. In some embodiments, such wavelength conversion components are produced by applying phosphor only on one surface of the Phos hat so that in assembly of an LED device or component the light affecting material (e.g., heavy scatterer to turn light) is right against or substantially adjacent to the Sapphire or Phos hat substrate, giving a clean edge for meniscus control.

In some embodiments, such wavelength conversion components are produced by spraying a substrate, e.g., LED chip, singulated on tape or other release material in a slightly spaced manner, which can allow for some phosphor to be applied on the sidewall of the substrate to form a Phos hat. This approach can, in some aspects, be useful where white-$TiO_2$ light affecting material is not used or is applied prior to placing of the Phos hat, which can, in some embodiments, avoid blue light escaping from sides of a Phos hat.

In some embodiments, substrate wafers can be sprayed, either above room temperature (e.g., hot or heated), or at room temperature, to make the Phos hats. In some aspects, it is suitable to spray the wafer at room temperature, followed by curing and then singulation of the die on the wafer.

Other benefits of wavelength conversion materials (e.g., phosphor, P) used in wavelength conversion components as disclosed herein, include, for example, improved far field images (e.g., thereby promoting a very uniform color appearance in the far field with a larger viewing angle), lower color shifts (lower dCCT), improved long term reliability (e.g., improved brightness maintenance (optics) at approximately 1000 hours or more), higher product ratings, cooler phosphor operating temperatures, and/or a lower color point spread, including all or any combination of such features.

Phosphors are one known class of luminescent materials. A phosphor may refer to any material that absorbs light at one wavelength and re-emits light at a different wavelength in the visible spectrum, regardless of the delay between absorption and re-emission and regardless of the wavelengths involved. Accordingly, the term "phosphor" may be used herein to refer to materials that are sometimes called fluorescent and/or phosphorescent. In general, phosphors may absorb light having first wavelengths and re-emit light having second wavelengths that are different from the first wavelengths.

Phosphors can, in some embodiments, be included in an encapsulant used on an LED device. The phosphor can emit radiation in the visible spectrum having lower energy than the radiation emitted by a light emitter and does so in response to the wavelength emitted by the emitter. Combinations of phosphors can be used in conjunction with the blue or UV-emitting chip/LED to create white light; e.g., blue and yellow, blue and green and red, and blue and green and yellow and red. Using three or more colors can provide an opportunity to select a particular white point and a better color rendering. It is also expected that LEDs with more than one emission peak will be useful in exciting one or more phosphors to produce white light.

Phosphors and/or phosphor compounds can be selectively added and/or applied in any desired amount or quantity to clear or substantially clear substrates, wafers or sheets of material. Application of the phosphor and/or phosphor compounds can be achieved via any suitable method including, for example, spraying, gravity sedimentation, centrifugation, addition of a solvent, screen printing, evaporation (sputter, e-beam, thermal, CVD, electrostatic and/or electrophoretic deposition), dipping, spin coating, direct dispensing, and/or vibration, including, for example, as described in U.S. Pat. No. 8,410,679 to Ibbetson et al., and U.S. Pat. No. 8,425,271 to Hussell et al., the disclosures of which are each hereby incorporated by reference herein in their entireties. In some embodiments, the phosphor compound applied to a clear substrate, e.g., sapphire wafer, is conformal to the shape and/or surface of the clear substrate. That is, a conformal layer of phosphor or phosphor compound can, for example, have an at least substantially uniform thickness.

The thickness of phosphor compound and/or phosphor layer on the clear substrate can, for example, range between approximately 2 µm and approximately 100 µm, however, any thickness of phosphor compound on the wavelength conversion component can be provided as desired. The thickness that is used may be selected to reduce or minimize blue light conversion in a planar surface, self-absorption and/or scattering, and may depend on the coating process, the density of the phosphor, other components in the phosphor compound, e.g., silicone, and/or the desired application.

Embodiments of the present disclosure are described herein with reference to cross-sectional view illustrations that are schematic illustrations of embodiments of the disclosure. As such, the actual thickness of the layers can be different, and variations from the shapes of the illustrations as a result, for example, of manufacturing techniques and/or tolerances are expected. Embodiments of the disclosure should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the disclosure herein.

Such LED devices and components can be used in a wide range of applications as they can serve as a LED component building block like other LED components.

In some embodiments provided herein is a light emitting diode (LED) device, also referred to as a light emitter component, which has a submount that has a plurality of electrically conductive traces formed on an upper (e.g., top) surface thereof; a plurality of electrically conductive pads formed on a lower (e.g., bottom) surface of the submount; a plurality of through-hole vias that electrically connect the electrically conductive traces to the electrically conductive pads, preferably through the thickness of the submount, internal to the submount; a plurality of LEDs that are in electrical communication with, and connected to, one or more of the plurality of electrically conductive traces, the plurality of LEDs being connected in controllable strings of LEDs, in parallel and/or in series, to define a plurality of controllable light emitting zones; a retention material in the form of at least one wall, which separates adjacent light emitter zones from each other; and an encapsulant material that is disposed over the plurality of LEDs.

In some embodiments, the retention material is arranged such that a top surface of each wall is taller than the top surface of the plurality of LEDs in the respective zone(s) contiguous with the respective wall. As such, while each wall may have any shape desired, such as that of a circle, square, triangle, rectangle, hexagon, or an irregular shape, one or more walls together form at least one light emitting zone therebetween. For example, two concentric square-shaped walls may define therebetween a light emitting zone, comprising one or more LEDs. In another example, a since wall may be arranged such that the ends thereof are contiguous with themselves (e.g., form a circle), defining a light emitter zone therein. It is advantageous for the encapsulant material to be no taller (e.g., have a depth that is less than or equal to) than the walls retaining the encapsulant material, so that the encapsulant material for each zone is physically separated from the encapsulant material in each other zone to prevent a mixing of light output in the encapsulant material in the region between the light emitting zones. In some embodiments, the shape of the walls formed from the retention material can be used to shape or otherwise alter the light emission pattern of the device and/or the light emitting zones adjacent thereto. Other arrangements will be understood by those skilled in the art.

In some embodiments, the encapsulant material in one or more light emitting zones may have a different composition to produce a different light output from the one or more light emitting zones. In other embodiments, the encapsulant material in one or more light emitting zones may be the same as in other light emitting zones, so that the light output is uniform. Where the encapsulant material is different, the device may be configured to produce multiple tunable colors, including red, green, and blue, or mixtures of various colors to produce true white or tunable white colors (e.g., warm white to cool white).

Retention material (e.g., 190, FIGS. 1-6), the encapsulant materials (see, e.g., FIGS. 1-6) and outer layers (e.g., 195, FIGS. 1-6) may also have one or more substantially flat (e.g., allowing for meniscus-forming deviations, depending on the viscosity of the material from which respective surface is made, from true flatness).

The plurality of LEDs may be the same, for example, in quantity, size, type, light intensity, connection type, and/or color output in each light emitting zone, in some embodiments. In some other embodiments, the device may include a plurality of different LEDs, having different characteristics to others of the light emitting devices. In some such embodiments, each of the light emitting zones may have a uniform or different arrangement, quantity, and/or type of LEDs connected therein. In some embodiments, one or more of the light emitting zones may contain individually addressable strings of LEDs that may be powered individually from the strings of at least one other light emitting zone on the device. In some such embodiments, the individually addressable strings may be powered by different voltages and/or by controlling an electrical current input supplied to one or more (e.g., each) of the individually addressable strings of LEDs.

Referring to the figures, which will be described further hereinbelow, a top view of a submount, generally designated 110, for use in an LED device (e.g., 100, see FIGS. 5A and 5B) is shown. A plurality of electrically conductive traces 120 are formed thereon. In the embodiment shown, submount 110 has four sets of electrically conductive traces, where each set can for example be a pair of electrically conductive traces. A first pair of electrically conductive traces has a first trace 121 and a second trace 122. A second pair of electrically conductive traces has a third trace 123 and a fourth trace 124. A third pair of electrically conductive traces has a fifth trace 125 and a sixth trace 126. A fourth pair of electrically conductive traces has a seventh trace 127 and an eighth trace 128.

Figure 4:
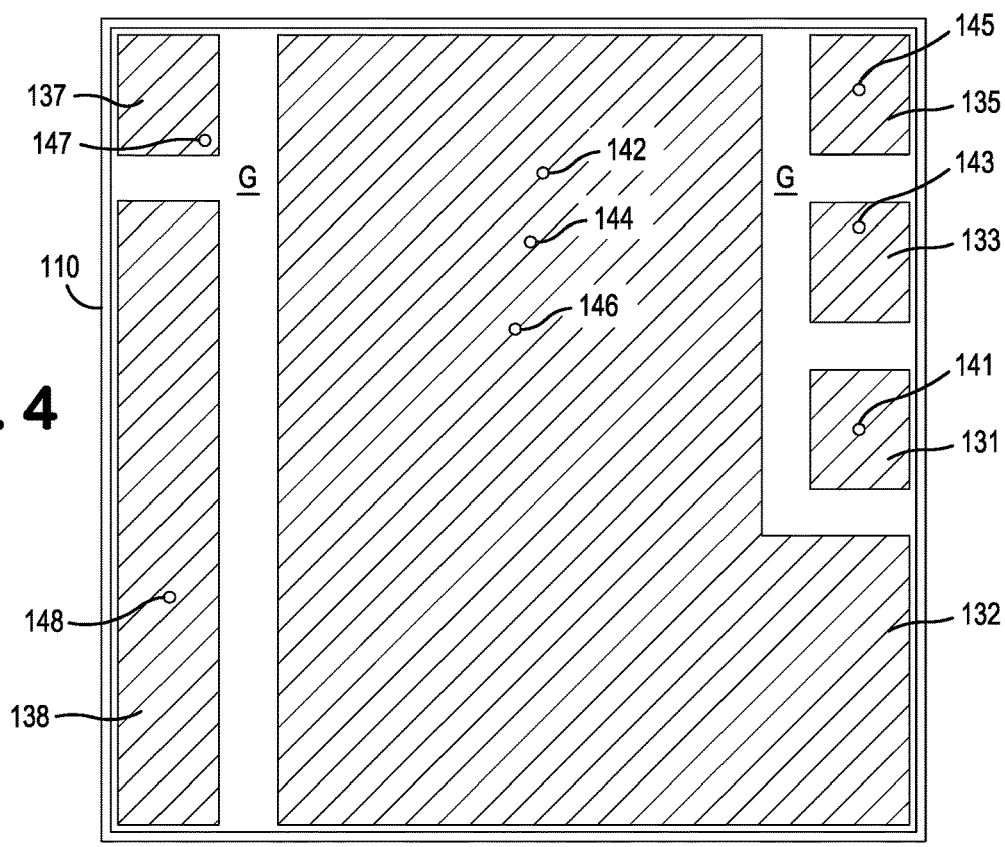
FIG. 4 is a bottom view of the submount of FIGS. 1 through 3, in accordance with the disclosure herein.

FIG. 4 shows a rear surface and a plurality of electrically conductive pads of submount 110. Using FIG. 4 as a reference, it can be seen in FIG. 1 that the first electrically conductive trace 121 is electrically connected to a first electrically conductive pad 131 by a first via 141. Similarly, third electrically conductive trace 123 is electrically connected to a third electrically conductive pad 133 by a third via 143. Fifth electrically conductive trace 125 is electrically connected to a fifth electrically conductive pad 135 by a fifth via 145. Second, fourth, and sixth electrically conductive traces 122, 124, and 126 are electrically connected to second electrically conductive pad 132 by second, fourth, and sixth vias 142, 144, and 146. Seventh and eighth electrically conductive traces 127 and 128 are electrically connected, respectively, to seventh and eighth electrically conductive pads 137 and 138 by respective seventh and eighth vias 147 and 148. It should be noted that, in order to maintain consistent numbering, because the second, fourth, and sixth electrically conductive traces 122, 124, and 126 are electrically connected to second electrically conductive pad, which is wired as a "common" pad electrically, fourth and sixth electrically conductive pads are not included in this embodiment. In some other embodiments, where each electrically conductive trace is independently wired to an electrically conductive pad, the fourth and sixth electrically conductive traces 124 and 126 can be electrically connected by fourth and sixth vias 144 and 146, respectively, to fourth and sixth electrically conductive pads, which can be electrically independent of second electrically conductive pad 132.

According to the embodiment of FIG. 1, the first through sixth electrically conductive traces 121 through 126 are configured as a concentric set of partial circles that are nested together, such that first electrically conductive trace 121 has a diameter that is larger than the diameters of the other electrically conductive traces, while the sixth electrically conductive trace 126 has the smallest diameter. While the first through sixth electrically conductive traces 121 through 126 have a shape, in the region where LEDs are to be attached thereto, of a circle, any suitable shape (or combination of shapes) for the first through sixth electrically conductive traces 121 through 126 may be selected, depending on a given application for the light emitting device. Furthermore, any number of electrically conductive traces can be used, depending on the particular requirements of the application for the light emitting device. Seventh and eighth electrically conductive traces 127 and 128 are, in this embodiment, electrically connected to solder regions for a centrally located main LED (see, e.g., 151, FIG. 2). As shown, so that each of the light emitting zones is individually addressable (e.g., controllable), each of the first, third, and fifth electrically conductive traces 121, 123, and 125 are physically and electrically isolated (e.g., separated or insulated) from each other, as well as from second, fourth, and sixth electrically conductive traces 122, 124, and 126. While second, fourth, and sixth electrically conductive traces 122, 124, and 126 are electrically common, being connected to each other at second electrically conductive pad 132, it is contemplated that second, fourth, and sixth electrically conductive traces 122, 124, and 126 may be electrically isolated from each other in some embodiments and, in other embodiments, that second, fourth, and sixth electrically conductive traces 122, 124, and 126 may be electrically isolated, while the first, third, and fifth electrically conductive traces 121, 123, and 125 are connected to a common electrically conductive pad.

Figure 2:
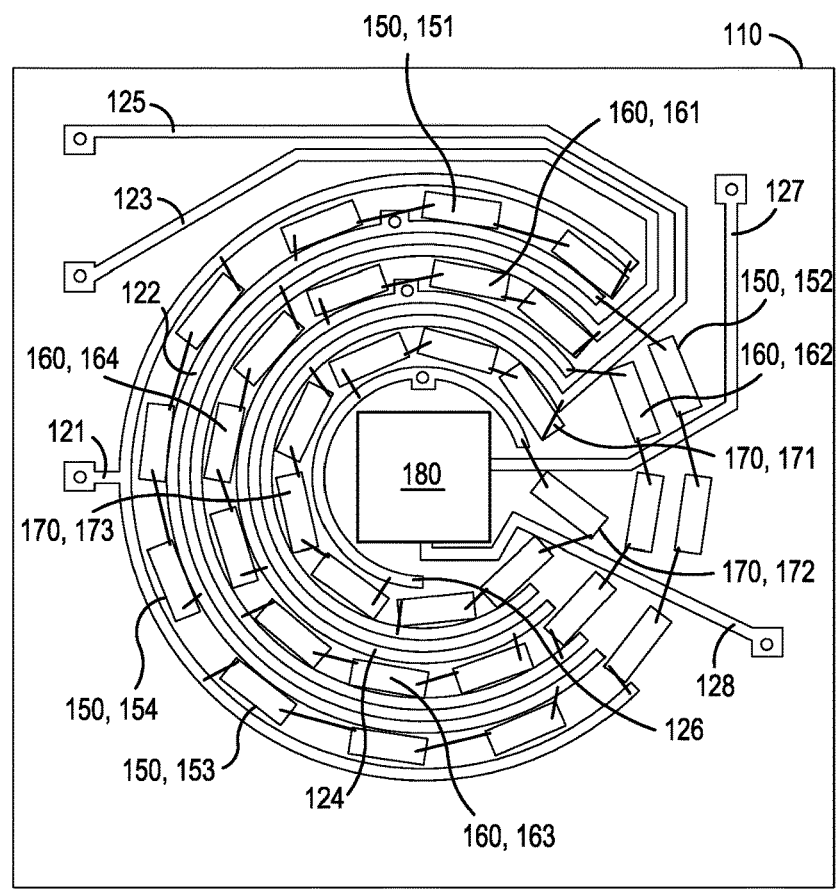
FIG. 2 is a top internal view of a light emitter device, having the submount of FIG. 1, and a plurality of light emitting devices (LEDs) thereon, which are connected by wirebonds, according to the disclosure herein.

Referring to FIG. 2, a plurality of LEDs are connected in a plurality of light emitter strings, some or all of which may be individually addressable (e.g., controllable). In this embodiment, each string of LEDs includes three LEDs connected in series, with a first in each string being connected to an electrically conductive trace of one of the plurality of sets or pairs of electrically conductive traces, and a last in each string being connected to another electrically conductive trace of the same pair of electrically conductive traces. According to this embodiment, the device includes four individually addressable light emitter zones, a first zone, a second zone, a third zone, and a fourth zone. These first, second, third, and fourth light emitter zones are illustrated in FIGS. 5A and 6.

The first zone includes an outermost plurality of LEDs, which are labeled as 150 and are concentrically arranged between the first and second electrically conductive traces 121 and 122. In this embodiment, the first zone includes twelve LEDs 150, which are connected in four parallel strings of three LEDs 150 each, such that the first string has three LEDs 151 connected in series; the second string has three LEDs 152 connected in series; the third string has three LEDs 153 connected in series; and the fourth string has three LEDs 154 connected in series. As illustrated in this embodiment, the first, second, third, and fourth strings of LEDs in the first light emitter zone are connected in parallel with respect to each other. The first zone can have any number of LEDs 150 and can be located at any position on submount 110, depending on the light output requirements of a particular application for the light emitting device. As such, the first zone has four strings of LEDs 150 electrically connected in parallel between the first and second electrically conductive traces 121 and 122, each string having three LEDs 150 connected in series. However, the LEDs 150 of the first zone may be electrically connected in any combination, including in a single string of LEDs or, in some embodiments, with each LED 150 in the first zone connected in parallel with respect to each other LED in the first zone.

The second zone includes a plurality of LEDs, which are labeled as 160 and are concentrically arranged between the third and fourth electrically conductive traces 123 and 124. In this embodiment, the second zone also includes twelve LEDs 160, which are connected in four parallel strings of three LEDs each. As such, the twelve LEDs 160 are connected such that the first string has three LEDs 161 connected in series; the second string has three LEDs 162 connected in series; the third string has three LEDs 163 connected in series; and the fourth string has three LEDs 164 connected in series. As illustrated in this embodiment, the first, second, third, and fourth strings of LEDs in the second light emitter zone are connected in parallel with respect to each other. The second zone can have any number of LEDs 160 and can be located at any position on submount 110, depending on the light output requirements of a particular application for the light emitting device. As such, the second zone has four strings of LEDs 160 electrically connected in parallel between the third and fourth electrically conductive traces 123 and 124, each string having three LEDs 160 connected in series. However, the LEDs 160 of the second zone may be electrically connected in any combination, including in a single string of LEDs or, in some embodiments, with each LED 160 in the second zone connected in parallel with respect to each other LED in the second zone.

The third zone includes a plurality of LEDs, which are labeled as 170 and are concentrically arranged between the fifth and sixth electrically conductive traces 125 and 126. In this embodiment, the third zone includes nine LEDs 170, which are connected in three parallel strings of three LEDs each. As such, the nine LEDs 170 are connected such that the first string has three LEDs 171 connected in series; the second string has three LEDs 172 connected in series; and the third string has three LEDs 173 connected in series. As illustrated in this embodiment, the first, second, and third strings of LEDs in the second light emitter zone are connected in parallel with respect to each other. The third zone can have any number of LEDs 170 and can be located at any position on submount 110, depending on the light output requirements of a particular application for the light emitting device. As such, the third zone has three strings of LEDs 170 electrically connected in parallel between the fifth and sixth electrically conductive traces 125 and 126, each string having three LEDs 170 connected in series. However, the LEDs 170 of the third zone may be electrically connected in any combination, including in a single string of LEDs or, in some embodiments, with each LED 160 in the third zone connected in parallel with respect to each other LED in the third zone.

The fourth zone includes, at least in this embodiment, a single LED 180, which is centrally arranged at a center of the submount 110 (e.g., at a center thereof). In this embodiment, LED 180 is of a larger size than any of the LEDs in the first, second, or third zones (e.g., LEDs 150, 160, and 170) and is electrically connected to the seventh and eighth electrically conductive traces 127 and 128 on a bottom surface of LED 180. As such, while LED 180 may be connected electrically to traces 127 and 128 in any suitable manner (e.g., by one or more wirebonds), in this embodiment, LED is a surface mount device (SMD) that has electrically conductive attachment pads on a bottom surface thereof, which are configured to attach LED 180 to the respective traces 127 and 128 in an electrically conductive manner. In this embodiment, the electrical potential (e.g., voltage) difference between the seventh and eighth electrically conductive traces 127 and 128 is different (e.g., higher) than the electrical potential between the first and second electrically conductive traces 121 and 122, the third and fourth electrically conductive traces 123 and 124, and the fifth and sixth electrically conductive traces 125 and 126, which can each have the same or a different electrical potential thereacross, respectively. In some embodiments, the fourth zone can have a plurality of LEDs that are connected in series and/or in parallel, depending on the electrical connections of such LEDs desired for each application.

Still referring to the embodiment of FIG. 2, in each of the first, second, third, and fourth zones, the respective LEDs (e.g., 150, 160, and 170) have one or more (e.g., two) electrical contacts (e.g., pads) on a top surface thereof and are connected to each other and also to the respective electrically conductive traces (e.g., 121, 122, 123, 124, 125, and 126) by wirebonds 158 that are attached to corresponding top surface electrical contacts of the LEDs (e.g., 150, 160, and 170), which are electrically connected to the upper surfaces of the respective electrically conductive traces or the upper portions of respective LEDs. In some embodiments, the arrangement and/or types of LEDs contained within the first, second, third, and fourth light emitter zones 101, 102, 103, and 104 can be opposite from that described above, such that the fourth light emitter zone 104 comprises a plurality of LEDs (e.g., smaller LEDs) and the first, second, and third light emitter zones 101, 102, and 103 can comprise one or more LEDs (e.g., larger LEDs, like, for example, LED 180). Any of the first, second, third, and fourth light emitter zones may contain any number, size, arrangement, and type of LEDs 150, 160, 170, and 180.

The first, second, third, and fourth zones can be configured as any of the aforementioned configurations, in any combination thereof. Furthermore, one or more (or all) of the LEDs (e.g., 150, 160, 170, and/or 180) of the first, second, third, and fourth zones can be the same type of LED, or can be any combination of LEDs, as will be understood by those having ordinary skill in the art. Furthermore, any number of light emitting zones are contemplated to achieve a desired light output pattern, intensity, color, and the like.

Figure 3:
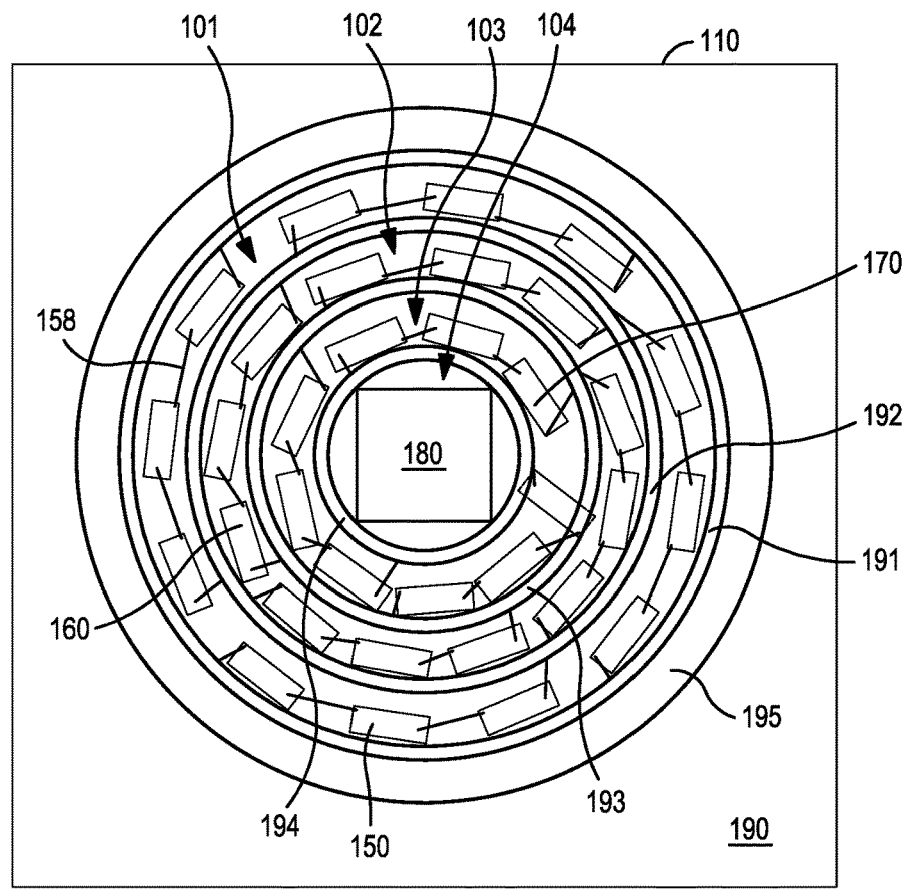
FIG. 3 is a top internal view of a light emitter device, having the submount and LEDs of FIG. 2, with the plurality of conductive traces omitted therefrom for clarity, and a retention material formed thereon as a plurality of walls to physically separate the light emitting zones of LEDs, according to the disclosure herein.

Referring to FIG. 3, a retention material 190 is shown disposed over (e.g., dispensed onto) the top surface of submount 110, defining four light emitter zones (101, 102, 103, and 104), which are separated by one or more substantially vertically oriented walls, each of which form at least a portion of retention material 190. Retention material 190 is made from, in some embodiments, a reflective (e.g., a white or metallic) material. Retention material 190 can be, for example, a viscous flowing material that is dispensed as a liquid and subsequently cured, or as a pre-formed (e.g., molded) structure. Retention material 190 can be dispensed directly onto the top surface of submount 110 or on top of an intermediate material between the retention material 190 and the submount 110. Radially outside of the first zone 101, the retention material 190 is in a form of a first wall 191, which has an outer portion 195 formed (e.g., integrally) on a radially outer surface thereof. The outer portion 195 tapers from a height of the first wall 191 down to a height determined by a thickness of the retention material 190 at the outer edges of the submount 110. As such, while it is possible for the outer portion 195 to extend outwardly to the edge of the submount 110, in the embodiment shown, outer portion 195 extends radially away from the first wall 191 so as to remain spaced apart from the edge of the submount 110, so that retention material 190 has a substantially flat (e.g., having a radius at the end(s) thereof) portion that extends to an outer edge of submount 110. In some embodiments, retention material 190 can extend over one or more of the lateral sides of the submount 110 to cover at least a part of one or more (e.g., all) of the lateral sides of the submount 110.

The second wall 192 is radially contained within (e.g., concentrically within) the first wall 191. As such, the first light emitter zone 101 is defined in the region between the outer (e.g., circumferential) surface of the second wall 192 and the inner (e.g., circumferential) surface of the first wall 191, such that the first plurality of LEDs 150 are disposed within the space defined therein.

The third wall 193 is radially contained within (e.g., concentrically within) the second wall 192. As such, the second light emitter zone 102 is defined in the region between the outer (e.g., circumferential) surface of the third wall 193 and the inner (e.g., circumferential) surface of the second wall 192, such that the second plurality of LEDs 160 are disposed within the space defined therein.

The fourth wall 194 is radially contained within (e.g., concentrically within) the third wall 193. As such, the third light emitter zone 103 is defined in the region between the outer (e.g., circumferential) surface of the fourth wall 194 and the inner (e.g., circumferential) surface of the third wall 193, such that the third plurality of LEDs 170 are disposed within the space defined therein. Furthermore, at least in the embodiment illustrated in FIG. 3, the fourth light emitter zone 104 is defined as the space that is radially within the inner (e.g., circumferential) surface of the fourth wall 194; as shown, the fourth light emitter zone 104 comprises a single main LED 180, which is physically larger and more powerful than the LEDs of the other light emitter zones, yet in other embodiments a fourth plurality of smaller LEDs may be used in place of main LED 180. The number of LEDs in such a fourth plurality of smaller LEDs may be dictated by light output requirements, power consumption limitations, and/or the geometry of the available size. While the retention material 190 is shown as being arranged in generally concentrically-arranged circles, any pattern is contemplated. Furthermore, while this embodiment shows each of the first, second, and third light emitter zones 101, 102, and 103 having a substantially similar width, the retention material 190 can be configured such that one or more of the light emitter zones is larger (e.g., wider, in this embodiment) than one or more of the other light emitter zones of the light emitter device.

Next, in FIG. 4, a rear side (e.g., a bottom side) of submount 110 is illustrated. Submount 110 has a plurality of electrically conductive pads on the bottom surface thereof. The LEDs of the first, second, and third light emitting zones are connected at their respective first ends to the first, third, and fifth electrically conductive pads 131, 133, and 135, respectively, and at their respective second ends to the second electrically conductive pad 132. Because the first, third, and fifth electrically conductive pads 131, 133, and 135 are electrically isolated from each other, each of the LEDs in the first, second, and third light emitter zones are individually addressable, so that the light output from each light emitter zone can be controlled separately. The second and electrically conductive pad 132 can be configured as either an anode or a cathode, with the respective first, third, and fifth electrically conductive pads 131, 133, and 135 being the corresponding cathode or anode, respectively. As such, the capability for individual addressability of the LEDs in each light emitter zone can be either anode-controlled or cathode-controlled. The seventh and eighth electrically conductive pads 137 and 138 are electrically isolated from each other and are configured to supply power to the main LED (e.g., 180, FIG. 2) at a separate voltage and/or current than that applied at the first, third, and fifth electrically conductive pads 131, 133, and 135. In some embodiments, the common electrically conductive pads, such as the second and eighth electrically conductive pads 132 and 138 can be combined into a single electrically conductive pad or, in some other embodiments, can be separated into multiple (e.g., four) independent electrically conductive pads. As shown, each of the electrically conductive pads are separated by a gap G, so that each of the electrically conductive pads are electrically isolated from each other.

Referring to FIGS. 5A and 5B, respective top and side external views of a light emitter device, generally designated 100, are illustrated. It can be seen in the view of FIG. 5A that all of the LEDs within the first, second, third, and fourth light emitter zones 101, 102, 103, and 104 are covered by an encapsulant material. In this embodiment, the first light emitter zone 101 is covered by a first encapsulant 115; the second light emitter zone 102 is covered by a second encapsulant 116; the third light emitter zone 103 is covered by a third encapsulant 117 dispensed therein; the fourth light emitter zone 104 is covered by a fourth encapsulant 118 dispensed therein. The first, second, third, and fourth encapsulants 115, 116, 117, and 118 can be the same encapsulant material, or can be configured to produce one or more colors of light emitted from the respective light emitter zones. Where the light emitter zones are configured to output different colors of light, such as red, blue, green, and white, or white light tones to produce true white or any temperature of light (e.g., from cool white to warm white,) each of the light emitter zones can have one or more of light conversion materials, reflective particles, and the like dispersed therein. Because each of the light emitter zones is individually addressable (e.g., by controlling an input current), by knowing the composition of the encapsulant in each light emitter zone, a total light output from the light emitter device can be controlled to produce any desired light pattern, intensity, color, and the like.

Furthermore, the level of encapsulant material in each light emitter zone is lower than a height of the adjacent walls formed by the retention material 190, so that there is no mixing of the encapsulant materials between the light emitter zones and, therefore, there is no mixing of light output within the encapsulant materials from the respective light emitter zones. For example, if the encapsulant were to extend above the height of the walls between the first and second light emitter zones 101 and 102, and the first and second encapsulants 115 and 116 are configured to output red and blue light respectively, then in the region therebetween, because the encapsulant material would be continuous between the light emitter zones, a mixing of the light output would result, causing purple light to be output at the region between the first and second light emitter zones 101 and 102. As such, it is advantageous to ensure that the encapsulant is dispensed in each light emitter zone to be no higher than the height of the wall(s) formed by the retention material 190 surrounding the light emitter zone.

Still referring to FIG. 5A, in one embodiment, each of the light emitter zones 101, 102, 103, and 104 contain an identical (e.g., a neutral, non-optical conversion material) encapsulant material, so that, while the intensity of the light output and the pattern of light output from the light emitter device can be controlled by varying a power provided to each of the light emitter zones, the output of color from such a device would not be tunable. In another embodiment, each of the light emitter zones 101, 102, 103, and 104 contain a different encapsulant. For example, first encapsulant 115 can be configured so that first light emitter zone 101 produces a light output with a red color, second encapsulant 116 can be configured so that second light emitter zone 102 produces light with a green color, third encapsulant 117 can be configured so that third light emitter zone 103 produces light with a blue color, and fourth encapsulant 118 can be configured so that fourth light emitter zone 104 produces light that is substantially colorless (e.g., white). In still another embodiment, each of the light emitter zones can have a variety of colors of white (e.g., from warm white to cool white) to allow for tunable (e.g., controllable) temperatures of white light to be emitted from light emitter device 100, which can range from cool white to warm white depending on the intensity of light output from each of the different light emitter zones having temperatures of white light being emitted therefrom. In such embodiments, high color rendering index light (e.g., true white) may be achieved by controlling the intensity of each type of light output from each of the differently-hued light emitter zones.

Figure 5C:
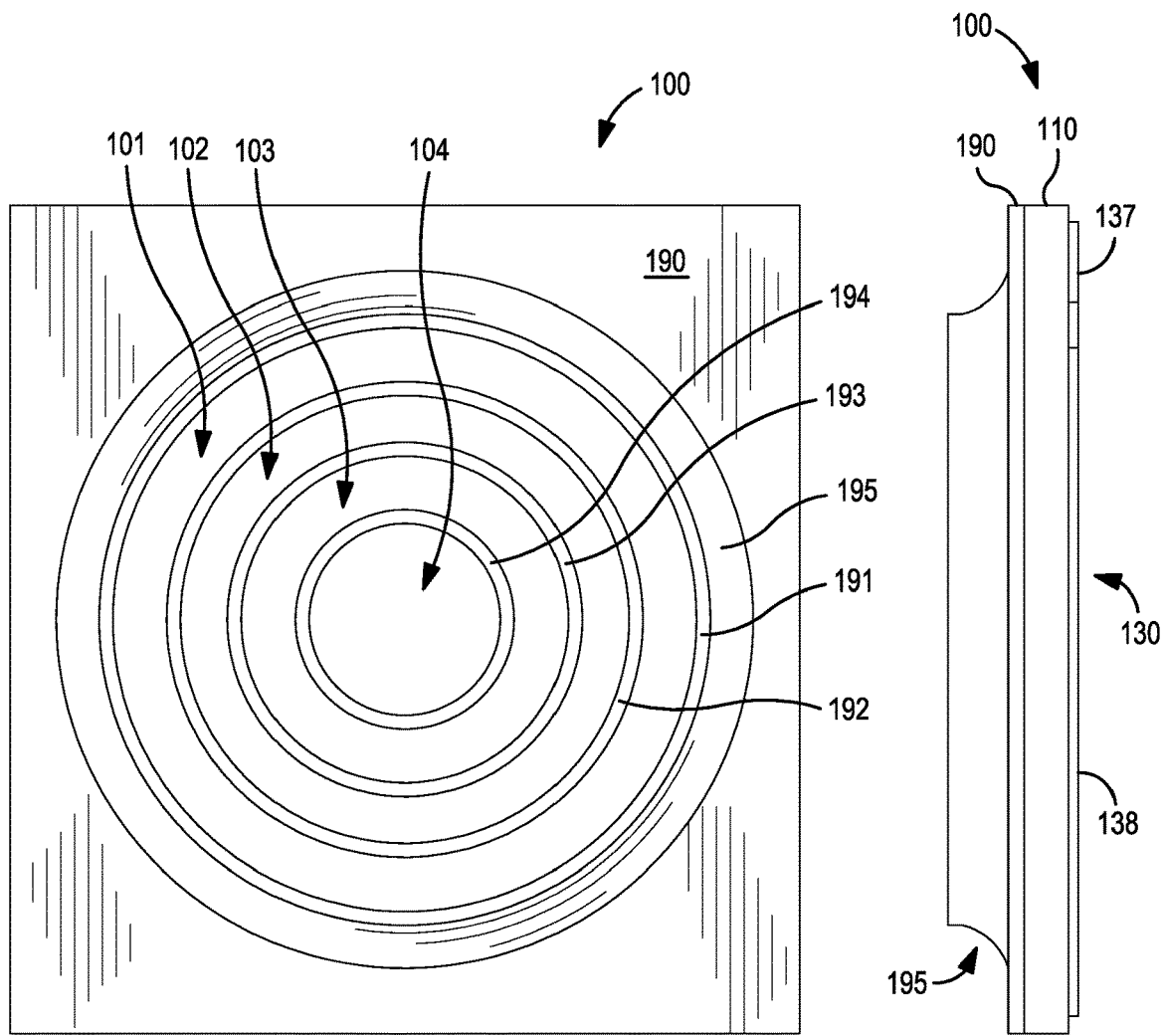
FIG. 5C is a side view of an alternate embodiment of the light emitter device of FIGS. 5A and 5B, with a lens attached on top of the retention material, in accordance with the disclosure herein.
Figure 5C:
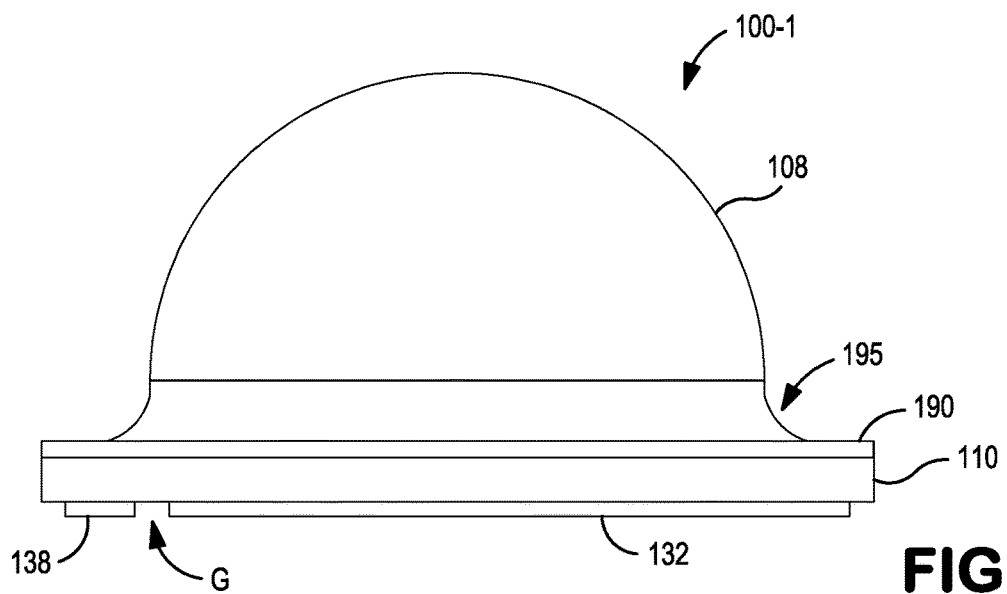
Figure 6:
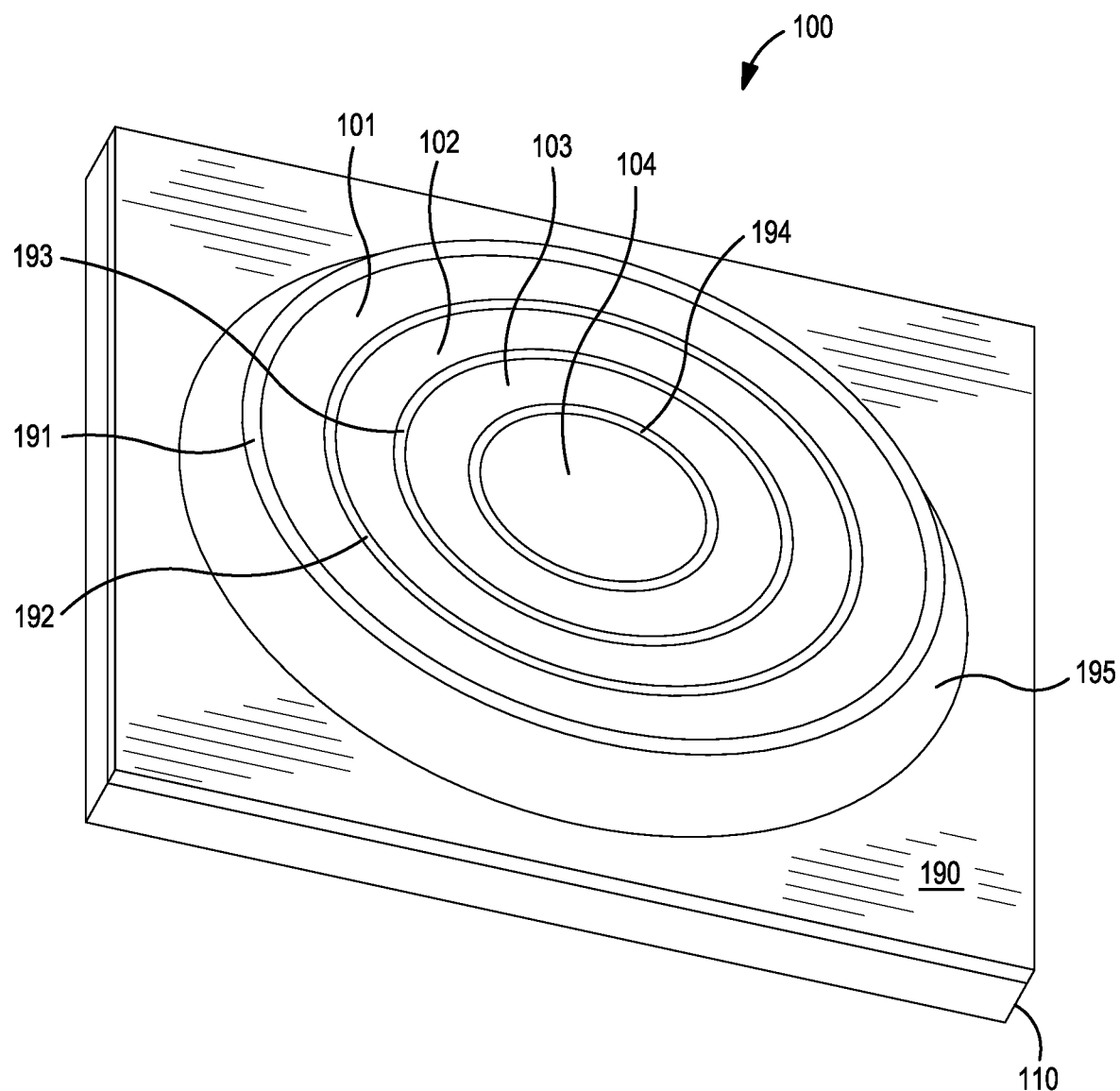
FIG. 6 is a perspective external view of the light emitter device of FIGS. 5A and 5B, in accordance with the disclosure herein.

In FIG. 5B, a side view of the light emitter device 100 is shown, with the retention material 190 being dispensed on top of the submount 110 and having an outer portion 195 arranged thereon. The plurality of electrically conductive pads (e.g., seventh and eighth electrically conductive pads 108 are shown on a bottom surface of the submount 110. In FIG. 5C, an optional lens 108 is shown attached to a top surface of retention material 190. In some embodiments, lens 108 can pass into the retention material 190 (e.g., retention material 190 can be formed around lens 108, retaining lens 108 onto light emitter device 100). Where the lens is molded, a secondary fill material can be arranged within lens 108 to eliminate any air from being entrapped within lens 108. In some embodiments, lens 108 can be molded and adhesively attached to light emitter device 100. In other embodiments, lens 108 can be dispensed onto light emitter device 100 in a liquid (e.g., a viscous) state and cured, such that the entirety of the top surface of the light emitter device is in contact with a bottom surface of the lens.

FIG. 6 is a perspective external view of light emitter device 100, illustrating the arrangement of the walls of the retention material to physically and optically separate the respective encapsulant material present in each light emitter zone from the encapsulant material present in other adjacent light emitter zones. The height of the walls of the retention material are selected based on the amount of mixing of light output from each light emitter zone, with taller walls being effective to segregate the light output and shorted walls allowing for light output from the zones to mix to a greater degree.

Figure 7:
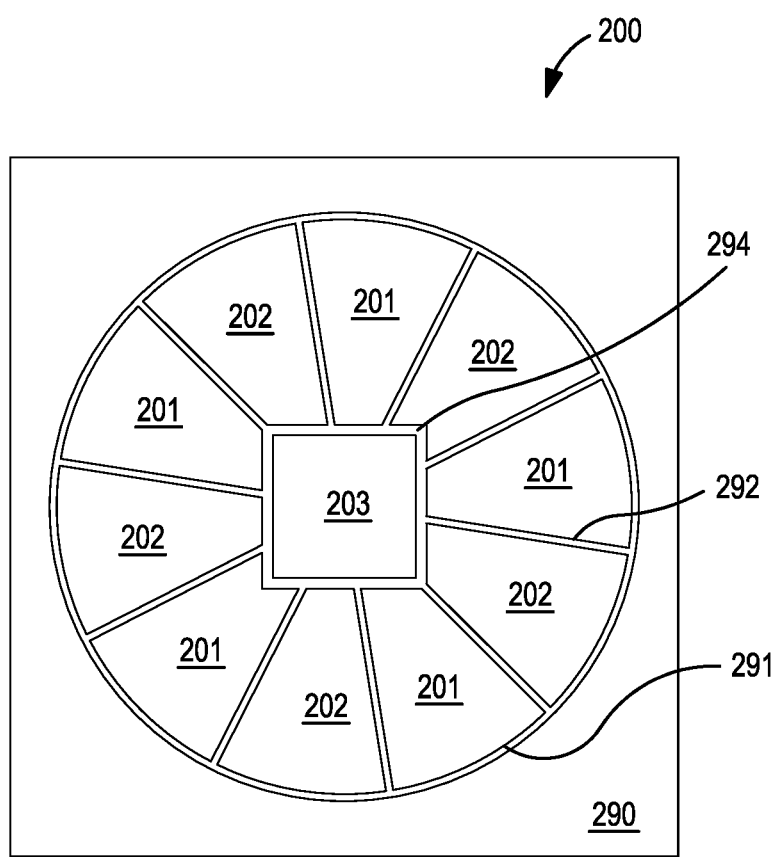
FIG. 7 is a top external view of a light emitter device according to a second example embodiment, in accordance with the disclosure herein.

Referring to FIG. 7, a second example embodiment of a light emitting device, generally designated 200, is shown. In this embodiment, the light emitter device 200 includes a submount with a plurality of electrically conductive pads (see, e.g., FIG. 4) attached on a bottom surface thereof. The top surface of the submount is covered substantially entirely by a retention material 290, which forms a circular outer wall portion 291, a square-shaped inner wall portion 294, and radially-oriented oriented wall portions 292 that connect the outer and inner wall portions 291 and 294, respectively. First and second light emitter zones are defined in an alternating pattern in the regions defined between the radial wall portions 292 and the outer and inner wall portions 291 and 294. As such, in this embodiment, the first and second light emitter zones 201 and 202 are actually split into several discrete regions that are staggered radially around the center of the light emitter device 200. A third light emitter zone 203 is contained entirely within inner wall portion 294. Each region of the first light emitter zone 201 contains a dispensed first encapsulant material that can be configured to produce a desired light output. Each region of the second light emitter zone 202 contains a dispensed second encapsulant material that can be configured to produce a desired light output. The third light emitter zone 203 contains a dispensed third encapsulant material that can be configured to produce a desired light output. The first, second, and third encapsulant materials can each be different (e.g., a different color or a different white temperature color) and/or a same encapsulant material to produce a desired light output of light emitter device 200. Each region of the first and second light emitter zones 201 and 202 may have one or more LEDs disposed therein, the LEDs of each discrete region being connected in parallel and/or in series with each other. Any combination of electrical connections for each of the first and second light emitter zones 201 and 202 is contemplated. Third light emitter zone 203 contains one or more LED (e.g., a main LED 180, FIG. 2, or a plurality of LEDs connected in one or more strings in parallel and/or in series).

Figure 8:
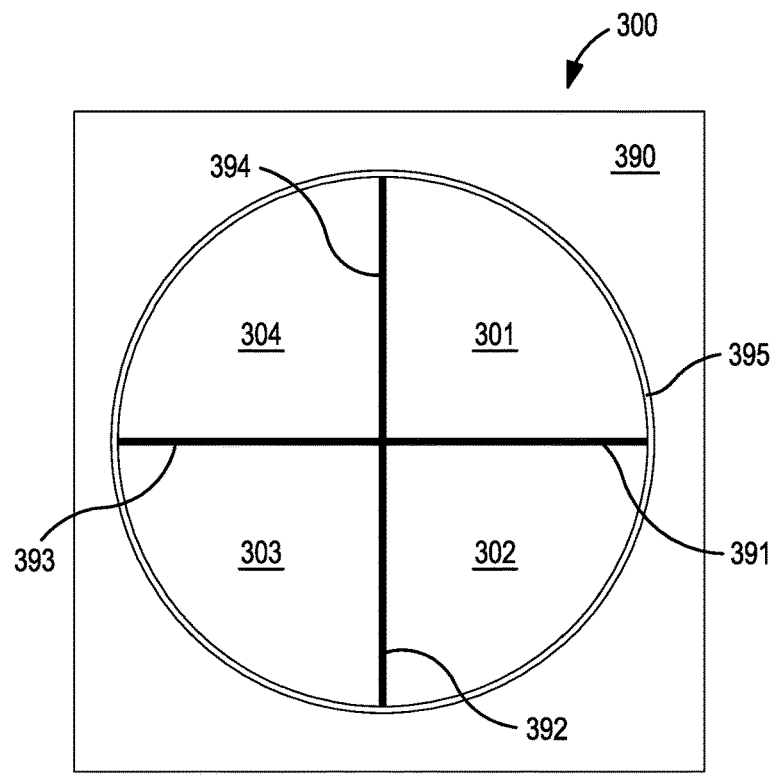
FIG. 8 is a top external view of a light emitter device according to a third example embodiment, in accordance with the disclosure herein.
Figure 9:
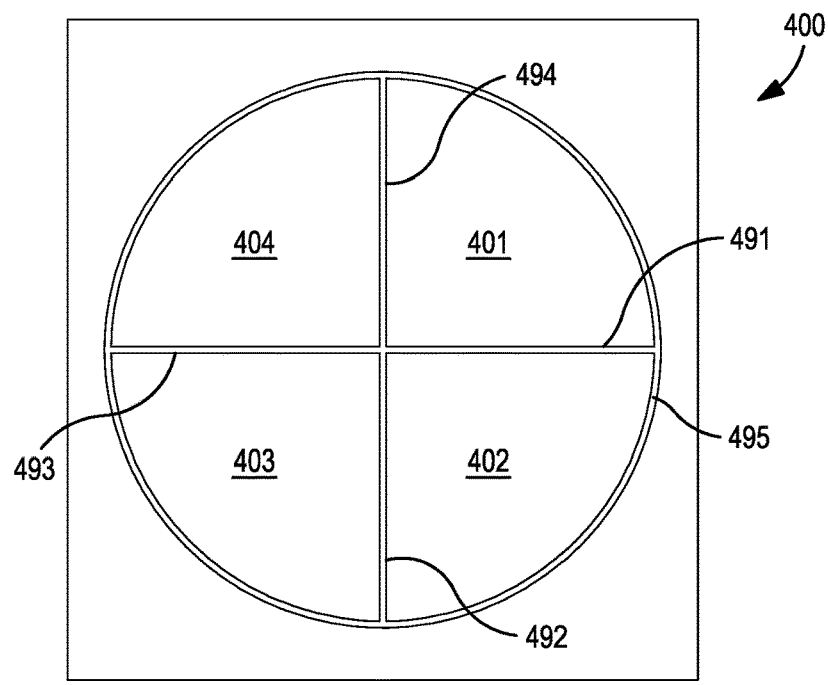
FIG. 9 is a top external view of a light emitter device according to a fourth example embodiment, in accordance with the disclosure herein.

In FIGS. 8 and 9, two further example embodiments of light emitter devices, generally designated 300 and 400, respectively, are shown. The light emitter device 300 includes four light emitter zones 301-304, which are internally separated by black wall portions 391-394. An outer circular wall 395 surrounds a perimeter of each quadrant light emitter zone 301-304. In the embodiment of FIG. 9, the wall portions 491-494 are colored white. In both light emitter devices 300 and 400, the light emitter zones contain a same or a different encapsulant material configured to produce a desired color output in each light emitter zone. For example, one of each light emitter zone may be configured to produce red light, blue light, green light, and white light, respectively, such that each light emitter zone produces a different color of light. In some other embodiments, each light emitter zone can contain different encapsulant materials that are configured to produce varying temperatures of white light (e.g., from cool white to warm white). In the embodiment of FIG. 8, where the wall portions 391-394 are black, they are configured to absorb, rather than scatter, light emitted from each adjacent light emitter zone, to produce increased contrast and optical definition (e.g., clarity) of each zone of the light emitter device 300. In the embodiment of FIG. 9, the white wall portions 491-494 are configured to scatter light from each of the zones of light emitter device 400, producing a more mixed light output pattern than is produced from light emitter device 300. In some embodiments, wall portions can be intermixed so that some walls are white and some walls are black.

Figure 10:
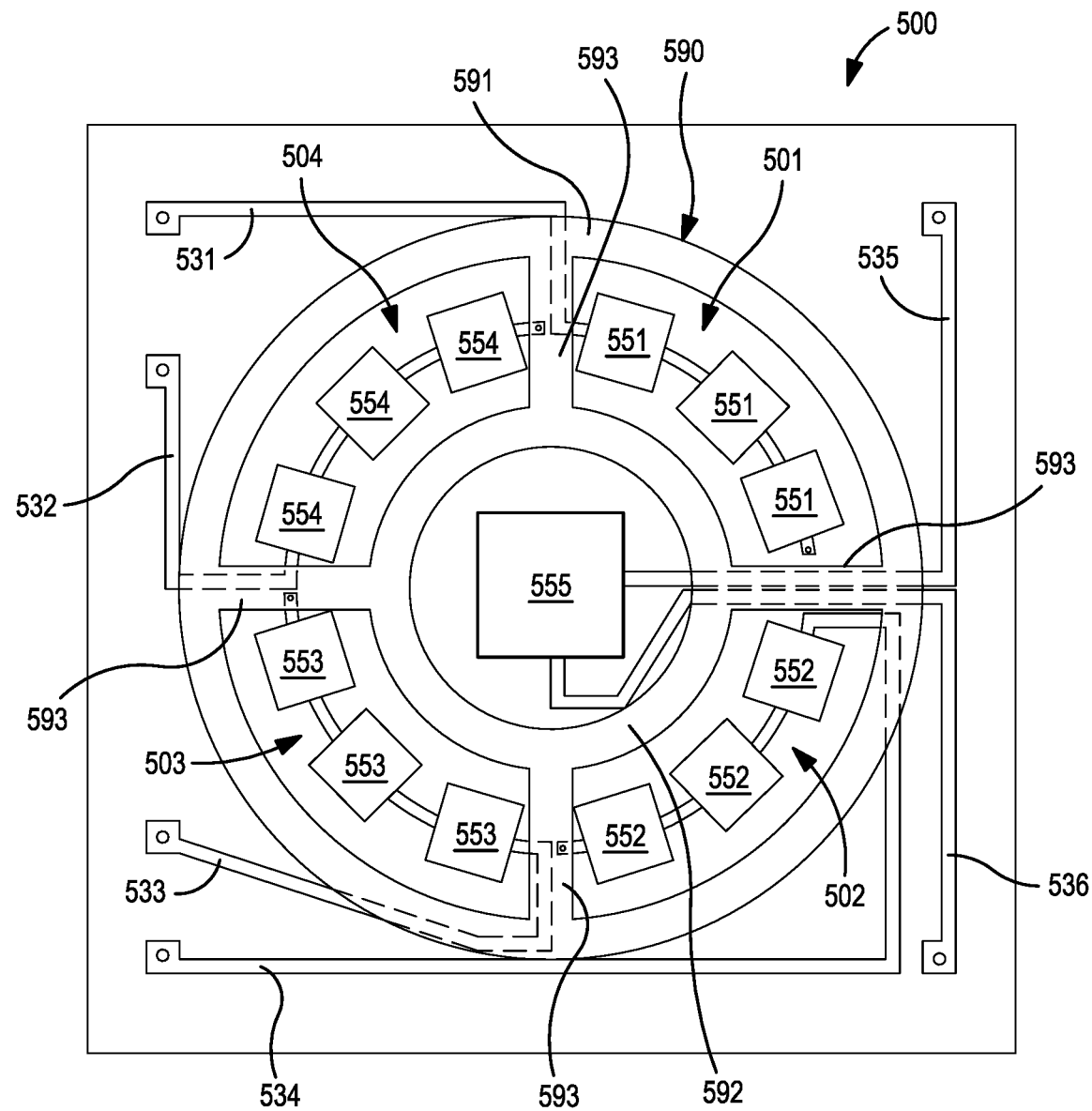
FIG. 10 is a top partially internal view of a light emitter device according to a fifth example embodiment, in accordance with the disclosure herein.

Referring to FIG. 10, a fifth example embodiment of a light emitter device, generally designated 500, is shown. Light emitter device 500 is generally a similar construction type as light emitter device 100, but has five light emitter zones 501-505, which are separated from each other by retention material 590. Retention material 590 is in a form of an outer wall 591, which is separated from and connected to an inner wall 592 by a plurality of radial walls 593. The submount 510 comprises a plurality of electrically conductive traces 531-536 formed on a surface of the submount 510. Each of the light emitter zones may be configured to output a different color of light. For example, first light emitter zone 501 contains a plurality of LEDS 551 that are connected in series by direct-attach methods. Second light emitter zone 502 contains a plurality of LEDS 552 that are connected in series by direct-attach methods. Third light emitter zone 503 contains a plurality of LEDS 553 that are connected in series by direct-attach methods. Fourth light emitter zone 504 contains a plurality of LEDS 554 that are connected in series by direct-attach methods. Fifth light emitter zone 505 contains a single main LED 555 that is connected to the fifth and sixth electrically conductive traces 535 and 536. Each of LEDs 551-555 may be the same or different, or any combination thereof. Similarly, each light emitter zone 501-505 contains an encapsulant material configured to produce one or more type of light output in each zone. The encapsulant material in each zone is held in place by retention material 590. Retention material 590 is dispensed on top of, at least in part, the electrically conductive traces 531-536. The plurality of LEDs in each of the first through fifth light emitter zones 501-505 are individually addressable, such that the light output of each light emitter zone can be controlled individually. The encapsulant material contained within each light emitter zone 501-505 can be a different or a same encapsulant material, to produce different light output colors from each light emitter zone 501-505. For example, the respective first, second, third, fourth, and fifth light emitter zones can be configured to output red, green, blue, yellow, and white light. In another example embodiment, each of the different light emitter zones can be configured to produce a different temperature of white light (e.g., from cool white to warm white).

Figure 11:
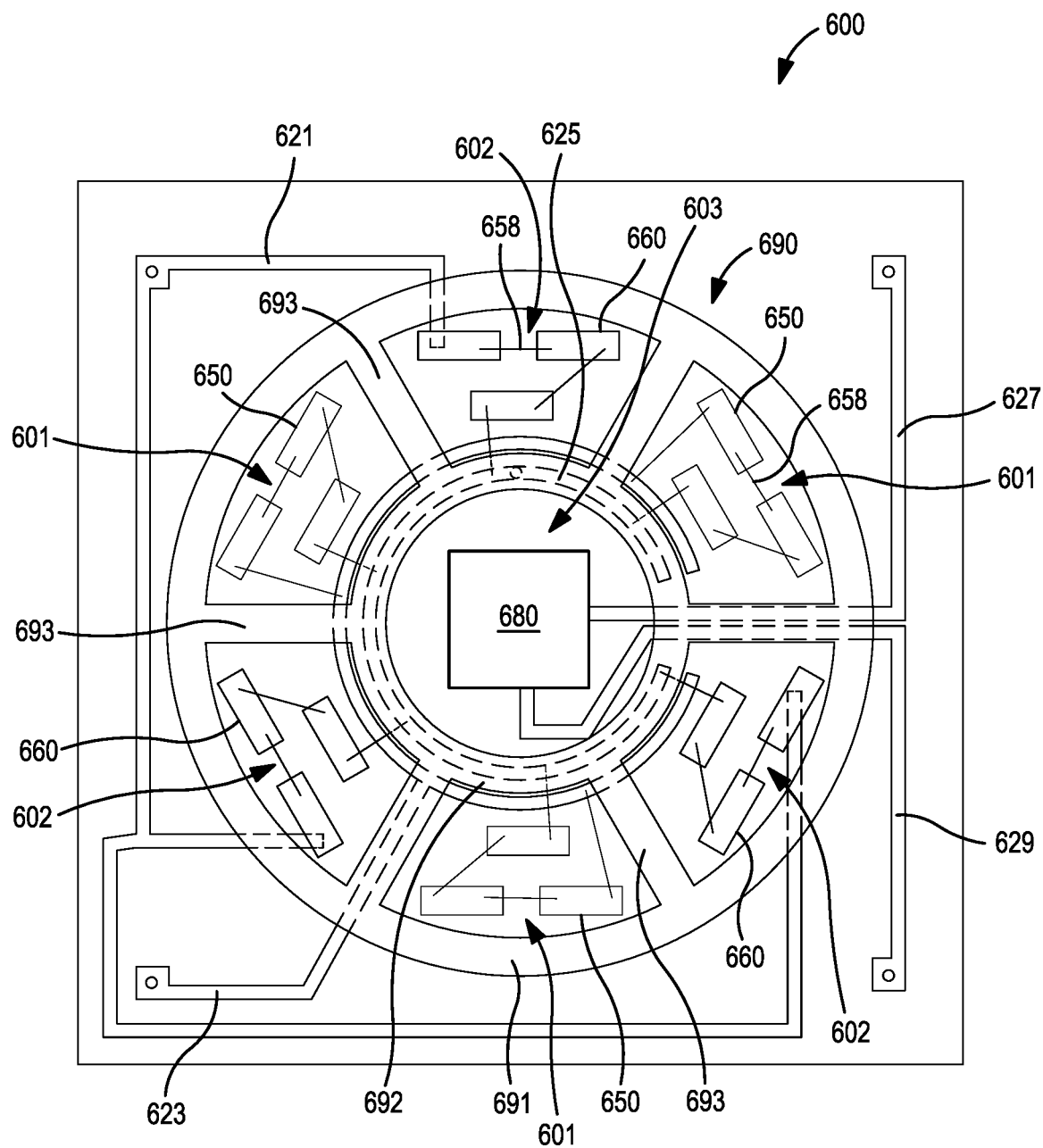
FIG. 11 is a top partially internal view of a light emitter device according to a sixth example embodiment, in accordance with the disclosure herein.

In FIG. 11, a sixth example embodiment of a light emitter device, generally designated 600, is shown. Light emitter device 600 has a plurality of three light emitter zones 601-603, with first and second light emitter zones 601 and 602 being staggered (e.g., arranged in an alternating pattern) around the third light emitter zone 603. The third light emitter zone 603 has a single main LED 680, but a plurality of LEDs may be used as well. The main LED 680 is connected by electrically conductive traces 627 and 628, which are formed on a top surface of the submount 610 and pass underneath retention material 690 that separates and defines the first, second, and third light emitter zones 601-603. Each portion of the first light emitter zone 601 comprises a plurality of LEDs 650 that are connected in series between the first electrically conductive trace 621, which is at least partially underneath the wall portions 693 and the inner portion 692 of the retention material 690, and a fifth electrically conductive trace 625, which is arranged underneath the inner portion 692 of retention material. Each portion of the second light emitter zone 602 comprises a plurality of LEDs 660 that are connected in series between the second electrically conductive trace 623, which is at least partially underneath the wall portions 693 and the inner portion 692 of the retention material 690, and a fifth electrically conductive trace 625, which is arranged underneath the inner portion 692 of retention material. As such, in this embodiment, each of the first and second light emitter zones 601 and 602 have three strings three of LEDs, with each of the three strings of each light emitter zone being connected in parallel to each of the other strings of LEDs within the respective light emitter zones 601 and 602. As such, the first, second, and third light emitter zones 501-503 are each individually addressable (e.g., electrically controllable), such that the color and intensity of light output from light emitter device 600 can be controlled to produce a desired output of light.

Figure 12A:
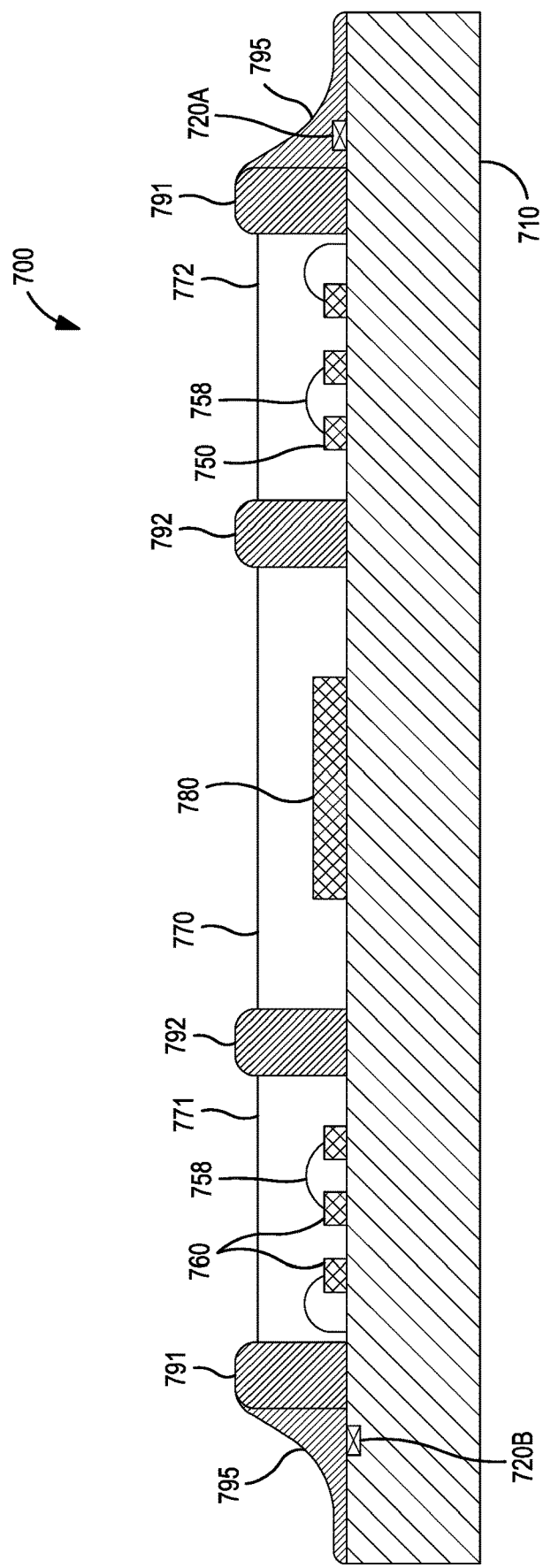
FIGS. 12A through 12C are respective cross-sectional views of several different example light emitter devices, in accordance with the disclosure herein.
Figure 12B:
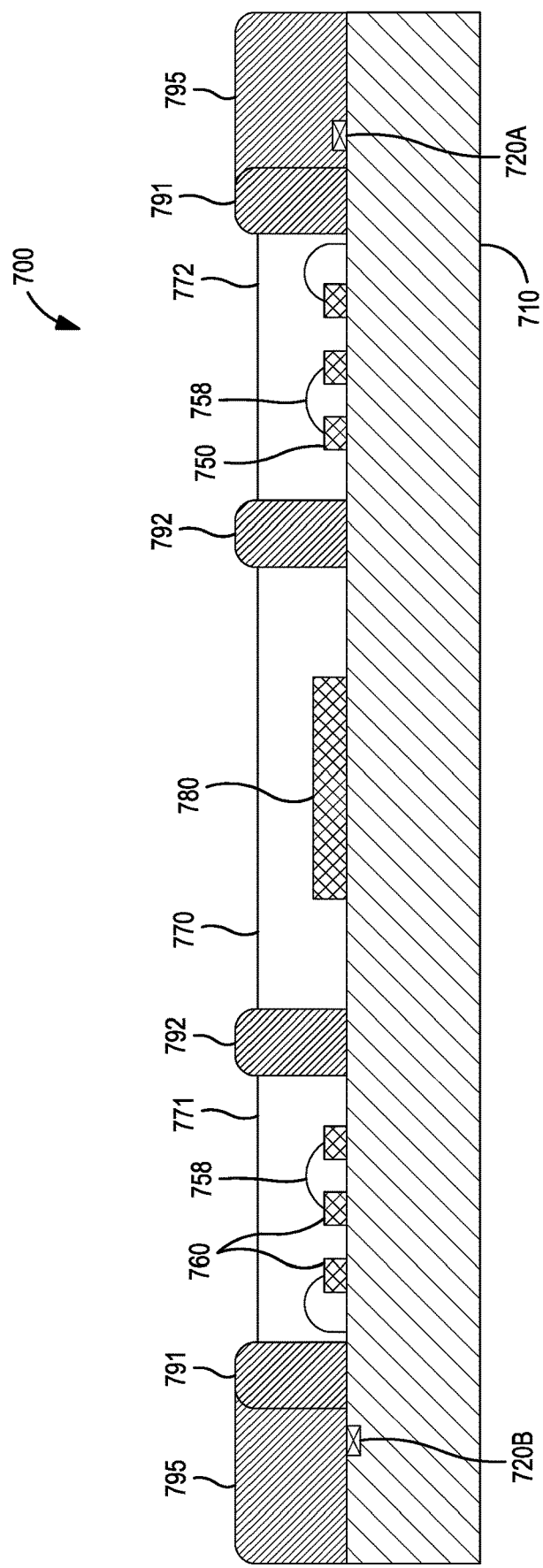
Figure 12C:
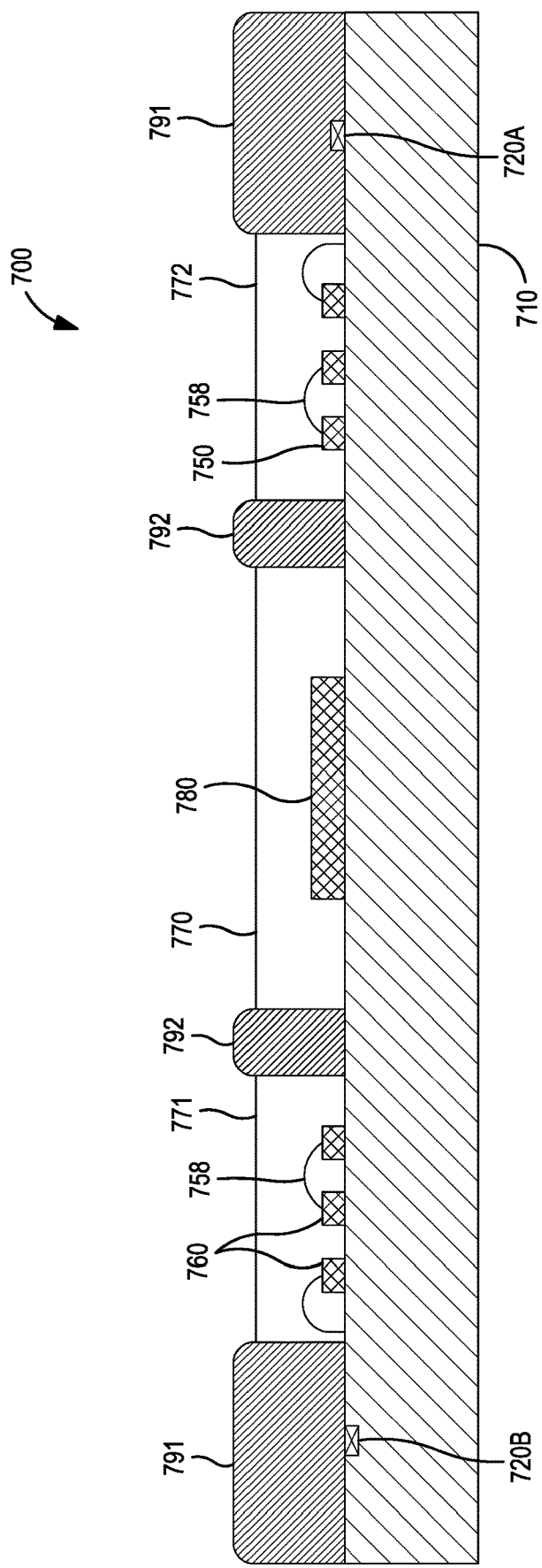

Referring to FIGS. 12A-12C, cross-sectional views of several alternative arrangements of a seventh example embodiment of a light emitter device, generally designated 700, is shown. As shown in each of FIGS. 12A-12C, the light emitter device 700 includes a submount 710, with at least three light emitter zones 701-703 shown.

The first light emitter zone 701 includes a main LED chip 780, which is a surface mount device (SMD) with bottom surface electrically conductive pads to electrically and mechanically attach the main LED 180 to one or more electrical traces formed on or in the top surface of the submount 710. In some embodiments, main LED 180 may be a plurality of LEDs of any suitable type. In still other embodiments, main LED 180 may be connected by wirebonds in place of at least one (or both) of the bottom surface electrically conductive pads described above. The first light emitter zone 701 contains a first encapsulant 770 dispensed over the main LED chip 780.

The first light emitter zone 701 is separated from the second and third light emitter zones 702 and 703 by the wall portions 792. Another wall may be provided elsewhere (e.g., out of the cross-sectional plane shown, see FIG. 11) in order to further separate the second and third light emitter zones 702 and 703 from being contiguous with and/or in contact with each other. The second light emitter zone 702 has a plurality of second LEDs 750 connected to each other and to electrically conductive traces by wirebonds 758 and a second encapsulant 772 is dispensed over the top of the plurality of second LEDs 750. The third light emitter zone 703 has a plurality of third LEDs 760 that are connected to each other and to electrically conductive traces by wirebonds 758 and a third encapsulant 774 is dispensed over the top of the plurality of third LEDs 760. In some embodiments, each of the LEDs in the first, second, and third light emitter zones 701, 702, and 703 may be of the same type and may be provided in any quantity, even having different quantities of LEDs in one or more (e.g., each, or all) of the respective light emitter zones 701, 702, and 703. The first, second, and third encapsulants 770, 772, and 774 are dispensed at a height that is the same as, or lower than, the wall portion 792 to prevent a mixing of light output from the light emitter zones in the regions therebetween.

The second and third light emitter zones 702 and 703 are bounded on an outer side by wall portion 791, which is formed from a retention material. The retention materials and encapsulant materials can be of any suitable type so that the light emitter device 700 produces a desired light output. The light emitter zones 701-703 are each individually addressable (controllable), so that each zone 701-703 can produce a different light output, in intensity, color, or any other suitable manner. Also, light emitter device 700 may include, for example, one or more structures or devices on and/or in the substrate, which can include, for example, one or more traces, one or more wirebonds, and/or one or more electrically active structures such as electrostatic discharge (ESD) devices, wherein the outer layer covers and is configured to protect the one or more structures on and/or in the substrate 710. In this embodiment, first and second structures or devices 720A and 720B are shown, with first device 720A disposed on the top surface of submount 710 and second device 720B embedded within, at least partially, the top surface of the submount 710. In some embodiments, embedded structures may protrude beyond the top surface of the submount 710. While one structure is shown being disposed on the top surface of the submount 710 and another is shown embedded within the top surface of the submount 710, light emitter device 700 can have a plurality of structures disposed on the top surface of the submount 710 and/or a plurality of structures that are embedded within, either partially and/or entirely, the top surface of the submount 710 (e.g., completely covered and/or such that the top surface thereof is substantially coplanar therewith).

In the embodiments of FIGS. 12A-12C, the retention material is dispensed as wall portions 791, 792, and as outer layer 795, which is contiguous with and extends radially outward from an outer surface of wall portion 791. In some embodiments, outer layer 795 may be provided around only a portion of the perimeter of wall portion 791. In other embodiments, substantially all of the perimeter of the wall portion 791 is covered by the outer layer 795. In some embodiments, the outer portion may have a height that is less than, equal to, or greater than, the height of the wall portion 791. The outer layer covers and protects the top surface of the substrate as well as the one or more structures that are disposed on top of, or are embedded at least partially within, the submount 710. In some embodiments, the outer layer and the retention material are identical or different materials. In some such embodiments, the retention material and the outer layer are made from materials having different viscosities. For example, the retention material may be made from a first material having a high viscosity, while the outer layer may be made from a second material having a viscosity that is lower (e.g., less than 90%, less than 75%, less than 50%, less than 25%, less than 10%, or less than 5%) than the viscosity of the first material forming the retention material. In still other embodiments, the retention material and the outer layer can be made from the same (e.g., identical) material. Outer layer 795 can also be a same or different color from a color of wall portion 791. As with wall portion 791, outer layer 795 can consist of, comprise, or have as a coating or other layer a reflective material where that is desired or a dark material so as not to reflect light when that is desired.

As shown in FIG. 12A, the outer layer 795 can have a same height as the height of the wall portion 791 where the outer layer 795 contacts wall portion, and then has a tapered profile (e.g., a reducing height) that decreases to a height of a substantially flat portion (e.g., allowing for meniscus-forming deviations, depending on the viscosity of the material from which the outer layer 795 is made, from true flatness) that extends to an outer edge of the submount 795. In some embodiments, the tapering profile can have a constant slope, which either ends spaced apart from, or at, the outer edge (e.g., perimeter) of the submount 710. In some other embodiments, outer layer 795 may extend to a point on the top surface of the submount spaced apart from the edge of the submount. In some embodiments, outer layer 795 has a complementary contour at the interface between outer layer 795 and wall portion 791. As shown, outer layer 795 has a radiused portion at the edge of the submount 710, but in other embodiments (e.g., where the light emitter device is singulated from a larger panel having a plurality of light emitter device), the outer edge of the outer layer 795 may have a substantially square (e.g., within 10°, within 5°, within 2°, or within 1°) profile. In the embodiment of FIG. 12B, outer layer may have a shape with upper and outer (e.g., perimeter) sides that are substantially flat (e.g., allowing for meniscus-forming deviations, depending on the viscosity of the material from which the outer layer 795 is made, from true flatness). In some embodiments, outer layer may have a constant height that is less than (e.g., shorter than) the height of outer wall 791. Referring to FIG. 12C, wall portion 791 extends all the way to an outer edge of the submount 710, with the outer layer 795 being omitted. In such embodiments, wall portion 791 can only be a retaining structure or can have one or more of the protective qualities described herein regarding outer layer 795 in addition to being a retaining structure.

Figure 13:
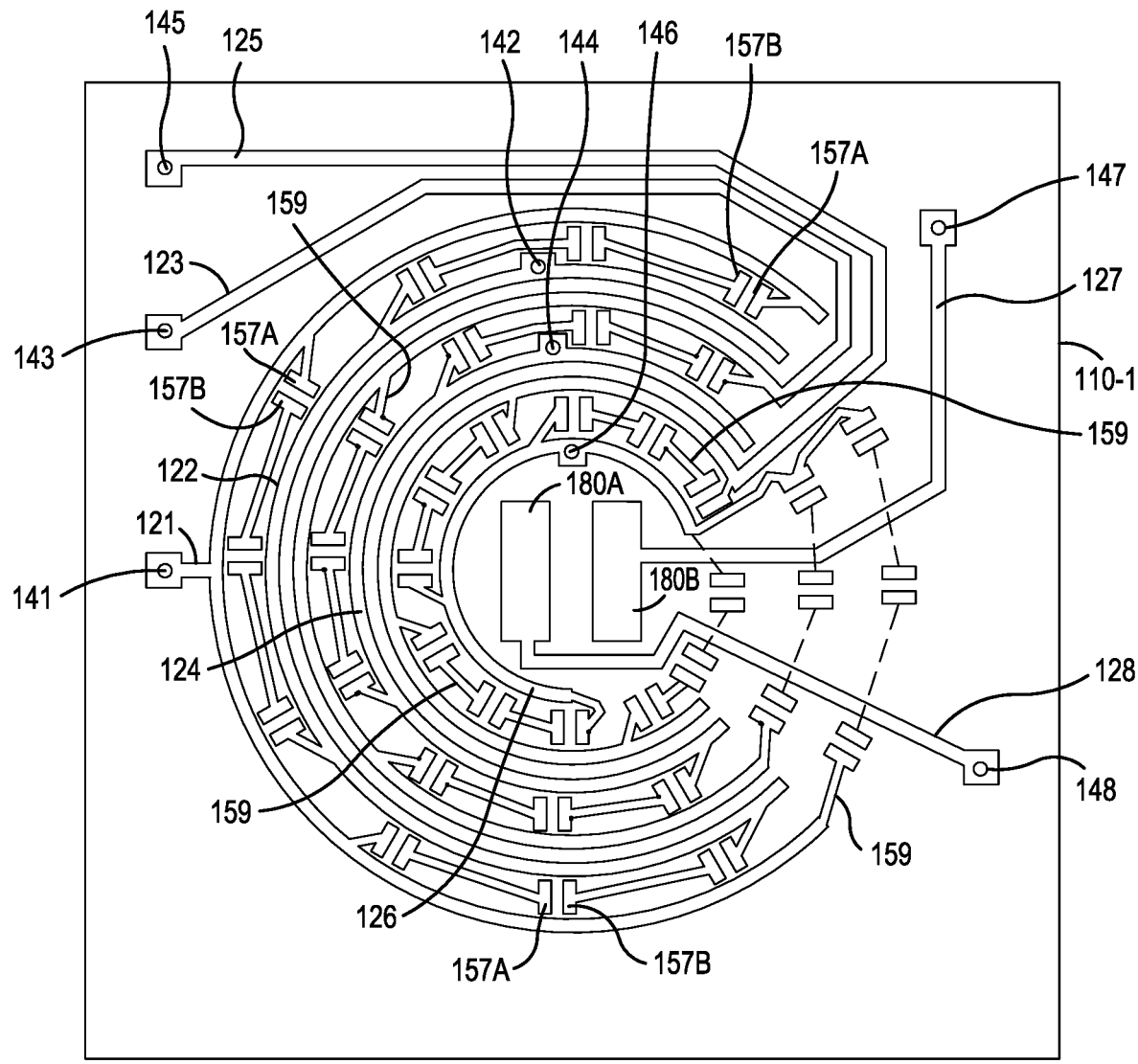
FIG. 13 is a top internal view of a light emitter device according to an alternate embodiment of that shown in FIG. 1, using primarily direct attach bonding pads, as well as wirebonds, in accordance with the disclosure herein.
Figure 14:
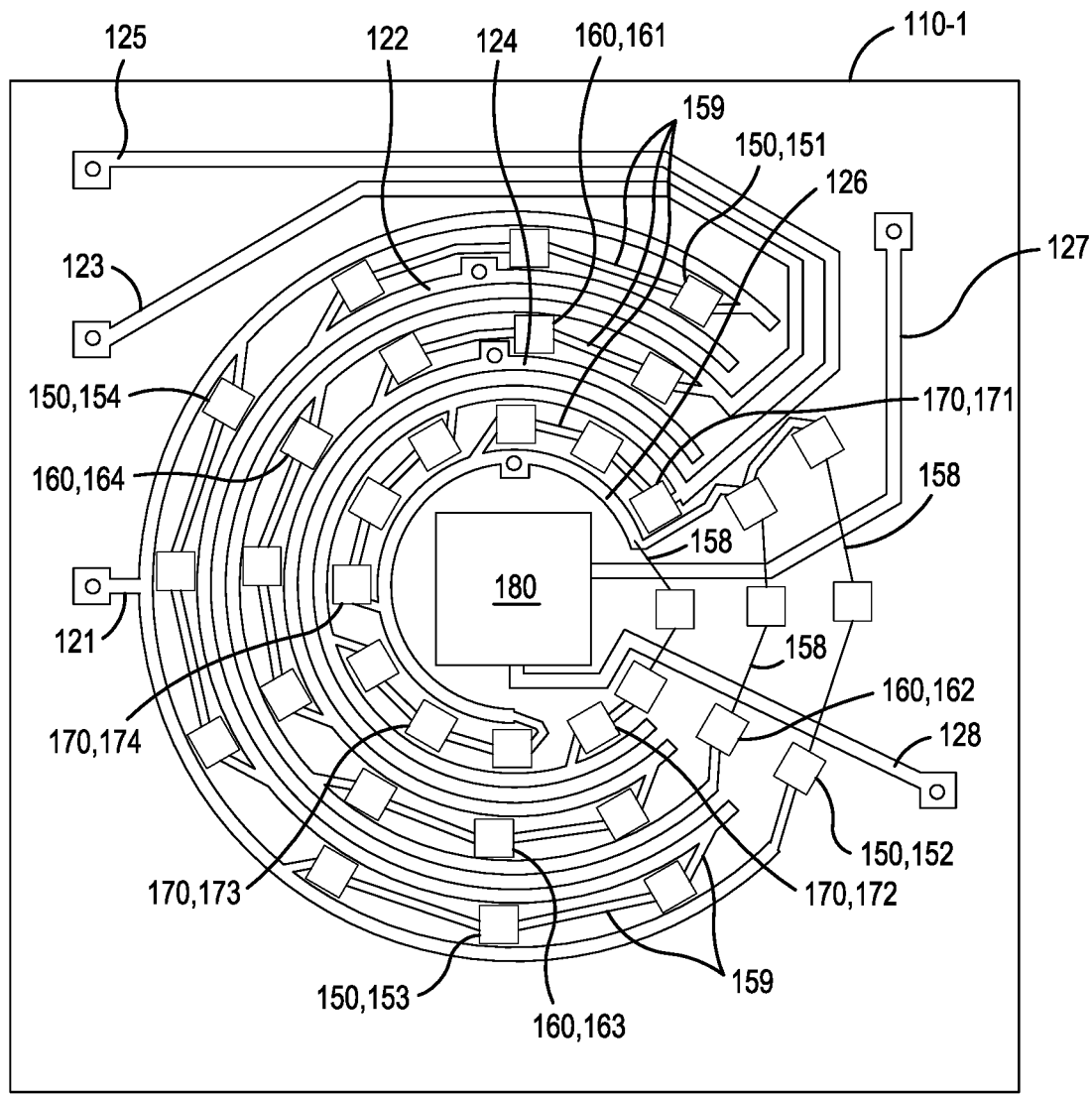
FIG. 14 is a top internal view of a light emitter device according to the partial illustration of FIG. 13, with a plurality of light emitting devices (LEDs) disposed on the bonding pads thereof, the LEDs being primarily directly attached to the bonding pads, in accordance with the disclosure herein.

Turning to FIGS. 13 and 14, a submount 110-1 is shown therein, which is similar in many ways to submount 110 in FIGS. 1 and 2 of the first embodiment. As such, the submount 110-1 is an alternate embodiment of submount 110. In the embodiment shown in FIGS. 13 and 14, submount 110-1 includes a plurality of electrically conductive traces 121-128 formed on a top surface of submount 110-1. As in the light emitter 100 in FIGS. 1-6, first, second, third, and fourth light emitter zones are individually addressable. Unlike in the embodiment of light emitter device 100, which connected the LEDs to each other and to the electrically conductive traces using wirebonds, the majority of LEDs are connected to submount 110-1 by being attached to first and second bonding pads 157A and 157B. The main LED 180 is attached to the first and second main bonding pads 180A and 180B. In the embodiment shown in FIGS. 13 and 14, at least one of the LEDs of the first, second, and third light emitter zones are connected by a wirebond 158, rather than by secondary electrically conductive traces 159, which are formed on the top surface of the submount 110-1. The arrangement of the LEDs in the first, second, third, and fourth light emitter zones are substantially the same as was described regarding the first embodiment of light emitter device 100, shown in FIGS. 1-6 and, as such, will not be repeated herein. However, at least one or more of the strings of LEDs in each of the first, second, and third light emitter zones is connected to a respective one of the electrically conductive traces by secondary electrically conductive traces 159.

Figure 15:
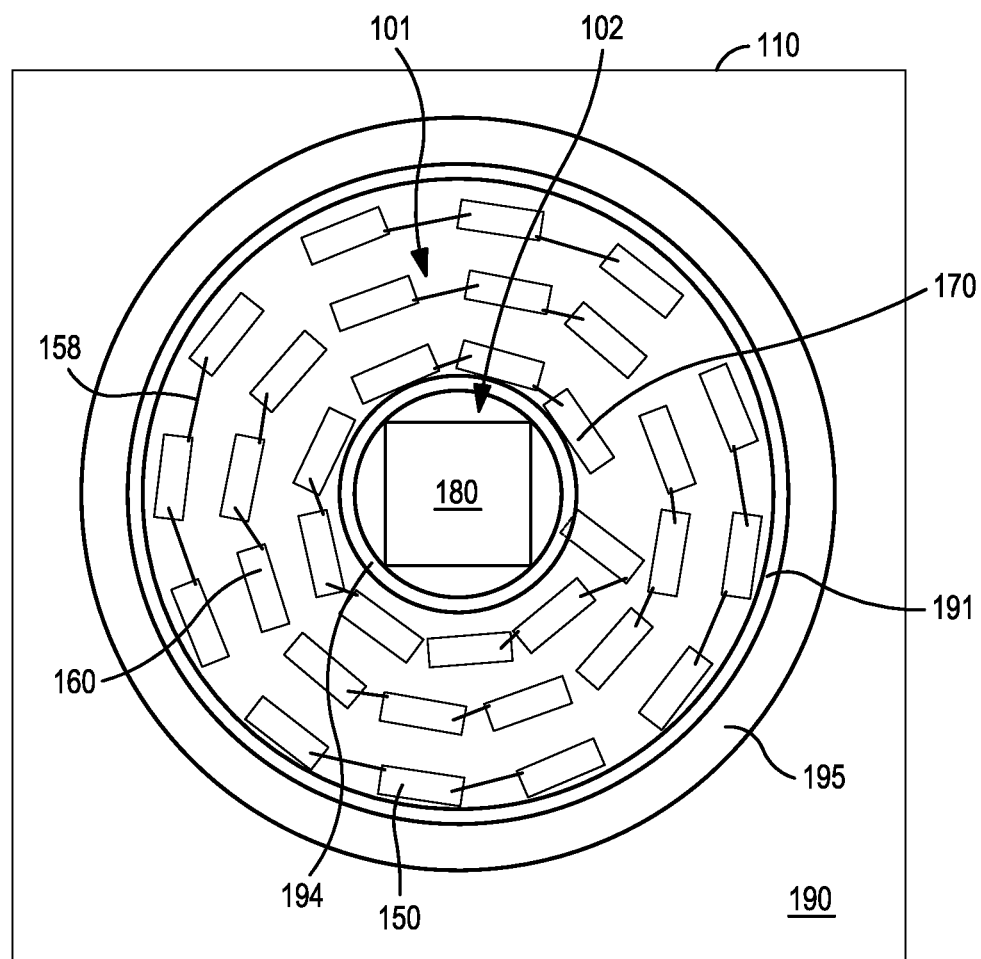
FIG. 15 is a top internal view of a light emitter device with two individually addressable light emitter zones, in accordance with the disclosure herein.
Figure 16:
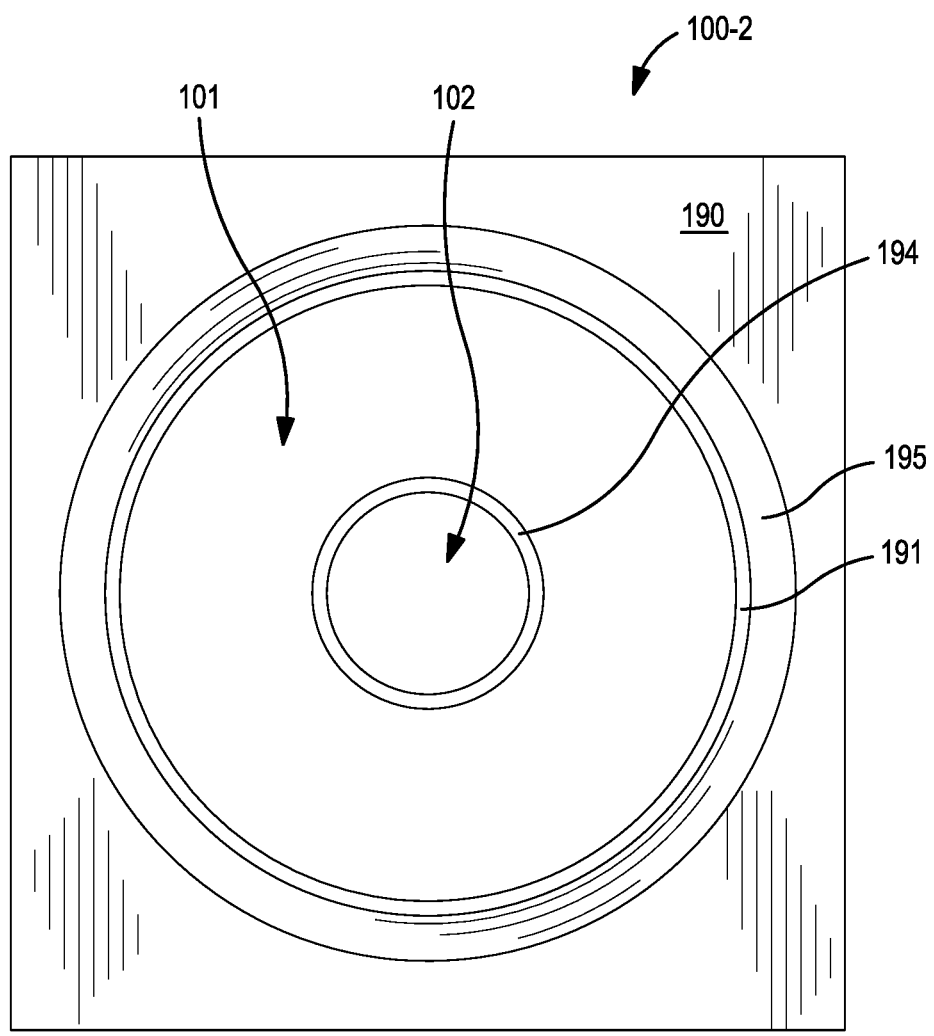
FIG. 16 is an external top view of a light emitter device, an internal view of which was shown in FIG. 15, with an encapsulant material disposed in the two individually addressable light emitter zones, in accordance with the disclosure herein.

In the embodiment illustrated in FIGS. 15 and 16, a submount 110 is substantially similar to the submount that is illustrated in the light emitter device embodiment shown in FIGS. 1-6. However, unlike that first embodiment, the retention material 190 in the embodiment of FIG. 15 is disposed over the submount 110 as an inner wall 194 that defines an inner, second light emitter zone, generally designated 102, which contains main LED 180, and an outer wall 191 that defines an outer, first light emitter zone, generally designated 101, between the outer and inner walls 191 and 194. The first light emitter zone can have any suitable attachment of, and electrical attachment between, the plurality of LEDs 150, 160, 170. In this embodiment, the plurality of LEDs 150, 160, 170 are connected by wirebonds 158, but direct attachment bonding pads (see, e.g., FIGS. 13 and 14) are contemplated as well, either in place of, or intermixed with the electrical connections represented by the wirebonds 158. Regardless of the type of electrical interconnections used (e.g., bonding pads and/or wirebonds), the retention material 190 is configured, in some embodiments, to cover at least a part of some such electrical connection types.

In this embodiment, the plurality of LEDs 150, 160, 170 may be individually addressable (e.g., controlled independently of each other) or may be tied together between common cathodes and anodes at their respective bonding pads (see, e.g., FIG. 4) so that the plurality of LEDs 150, 160, 170 are energized to a substantially similar luminance level. The main LED may be connected to a separate power source to achieve independent control between the first and second light emitter zones 101 and 102. In some embodiments, the main LED 180 can be replaced with a plurality of LED chips, which can be the same as, or different from, the plurality of LEDs 150, 160, 170 in the first light emitter zone 101.

The retention material 190 is disposed over (e.g., attached as a solid molded piece, or dispensed as a viscous flowable liquid) the top surface of the submount 110, so as to cover substantially all (e.g., greater than 80%, greater than 90%, greater than 95%, greater than 98%, or greater than 99%) of the area of the top surface of the submount 110 outside of the outer wall 191. The height of outer and inner walls 191 and 194 are taller than a height of the plurality of LEDs 150, 160, 170 and the main LED 180, so that an encapsulant material can be dispensed thereover to cover the plurality of LEDs 150, 160, 170 and the main LED 180. In all embodiments, the height of the walls of the retention material 190, as well as the composition (e.g., color, reflectivity, etc.) thereof, can be selected in order to produce a desired light emission pattern from the various light emitter zones. In some embodiments, retention material 190 is an electrical isolator and is configured to prevent damage from occurring to the top surface of the submount and/or the plurality of LEDs 150, 160, 170 and the main LED 180 disposed thereon. The tapering portion 195 is both aesthetically pleasing and also provides enhanced damage-resistance from impacts due to its tapered profile. In some embodiments, the arrangement and/or types of LEDs contained within the first and second light emitter zones 101 and 102 can be opposite from that described above, such that the second light emitter zone 102 comprises a plurality of LEDs (e.g., smaller LEDs) and the first light emitter zone 101 can comprise one or more LEDs (e.g., larger LEDs, like, for example, LED 180). Any of the first and second light emitter zones may contain any number, size, arrangement, and type of LEDs 150, 160, 170, and 180.

As seen in FIG. 16, a second alternative embodiment to the light emitter device 100 of FIGS. 1-6, is shown, with the light emitter device shown in FIG. 16 being generally designated 100-2. As shown in FIG. 16, first and second light emitter zones 101 and 102 have respective encapsulant materials disposed thereon. In order to prevent a mixing of encapsulant materials (and, hence light output colors) between the respective first and second light emitter zones 101 and 102, the encapsulant material in each light emitter zone has a height that is less than, or equal to, a height of the adjacent walls surrounding the respective encapsulant material.

In some embodiments, the encapsulant material in the first light emitter zone 101 differs from the encapsulant material in the second light emitter zone 102, such that a light output from the first light emitter zone 101 is different (e.g., a different color, refractivity, transmissivity, etc.) from the light output from the second light emitter zone 102. In such embodiments, the light output intensity (e.g., the brightness) of the respective first and second light emitter zones 101 and 102 can be controlled independently to produce a desired color of light output (e.g., a mixture of the respective colors produced by the first and second light emitter devices 101 and 102, such as white light, including cool white, warm white, and true white, or a mixture of two colors, such as purple, by combining red and blue light outputs).

In some embodiments, the encapsulant material in the first light emitter zone 101 is the same as the encapsulant material in the second light emitter zone 102, such that a light output from the first light emitter zone 101 is the same, in at least one aspect (e.g., a same color, refractivity, transmissivity, etc.), as the light output from the second light emitter zone 102. In such embodiments, the light pattern of the light output from the light emitter device 100-2 can have a variable dispersion pattern, intensity, and the like, by controlling the level at which the LEDs of the respective first and second light emitter zones 101 and 102 are energized, in terms of power consumption (e.g., by controlling an input current) and/or by energizing independent strings of LEDs (e.g., energizing the plurality of LEDs 150 at a higher level than the plurality of LEDs 160 or 170) within the same light emitter zone (e.g., 101) to produce a different light output intensity than other pluralities of LEDs 160 and/or 170 in the same light emitter zone.

In some aspects, a method of manufacturing a light emitter device is provided, the method including steps of: providing a substrate with a top surface and a bottom surface; forming a plurality of electrically conductive traces on the top surface of the substrate; attaching a plurality of LEDs on the top surface of the submount; assigning one or more LEDs of the plurality of LEDs into respective light emitter zones to define a plurality of light emitter zones; electrically connecting, in each light emitter zone, the one or more LEDs to one or more trace of the plurality of traces; dispensing a retention material over the top surface of the substrate to physically separate each of the plurality of light emitter zones from each other; dispensing an encapsulant material over the one or more LEDs of each of the plurality of light emitter zones; and electrically isolating one or more of the plurality of electrically conductive traces so that at least one of the plurality of light emitter zones is individually addressable from others of the plurality of light emitter zones to control a light output from the light emitter device.

In some embodiments thereof, the step of dispensing the retention material includes forming a plurality of walls with a height greater than a height of the one or more LEDs in light emitter zones that are contiguous with the plurality of walls. In some such embodiments, a height of the encapsulant material in each of the plurality of light emitter zones is less than or equal to a height of contiguous walls of the plurality of walls.

In some embodiments, the retention material covers at least part of the plurality of traces. In some embodiments, the step of attaching the plurality of LEDs comprises using a wirebond between the plurality of LEDs and/or between one or more of the plurality of LEDs and the plurality of electrically conductive traces. In some embodiments, the step of attaching the plurality of LEDs comprises using a direct attach method to connect the plurality of LEDs to a plurality of intermediate bond pads. In some embodiments, the one or more LEDs in one or more of the plurality of light emitter zones comprise a plurality of strings of serially-connected LEDs that are electrically isolated from the one or more LEDs of others of the plurality of light emitter zones. In some embodiments, the retention material comprises one or more walls that physically separate the plurality of light emitter zones from each other, and wherein the walls comprise a light absorbing material or a light reflecting material.

In some embodiments, the plurality of traces includes at least a first set of electrically conductive traces, a second set of electrically conductive traces, and a third set of electrically conductive traces; the plurality of light emitter zones includes at least a first light emitter zone, a second light emitter zone, and a third light emitter zone, each of the first, second, and third light emitter zones having a different encapsulant material from each other, and the one or more LEDs in each of first, second, and third light emitter zones being individually addressable to produce a plurality of different light outputs. In some such embodiments, the encapsulant material of each of the first, second, and third light emitter zones are configured to produce a white light in a range of light temperatures, including true white. In other such embodiments, the method includes the steps of subdividing the first and second light emitting zones and arranging the subdivided portions of the first and second light emitting zones radially around the third light emitter zones in an alternating pattern.

In some embodiments, the retention material and/or the encapsulant material are dispensed as a viscous liquid material.

In some embodiments, the plurality of traces includes at least a first set of electrically conductive traces, a second set of electrically conductive traces, a third set of electrically conductive traces, and a fourth set of electrically conductive traces; the plurality of light emitter zones includes at least a first light emitter zone, a second light emitter zone, a third light emitter zone, and a fourth light emitter zone; each of the first, second, third, and fourth light emitter zones have a different encapsulant material from each other; and the one or more LEDs in each of first, second, third, and fourth light emitter zones are individually addressable to produce a plurality of different light outputs. In some such embodiments, the first, second, and third light emitting zones have a shape of a ring and the method includes the steps of arranging the first light emitter zone concentrically around the second light emitter zone; arranging the second light emitter zone concentrically around the third light emitter zone; and arranging the third light emitter zone concentrically around the fourth light emitter zone. In other such embodiments, each of the first, second, third, and fourth light emitter zones are in a quadrant of a shape formed by each of the first, second, third, and fourth light emitter zones.

In some other such embodiments, the encapsulant material of the first, second, third, and fourth light emitter zones are configured such that the first light emitter zone emits a red light, the second light emitter zone emits a green light, the third light emitter zone emits a blue light, and the fourth light emitter zone emits a white light. In still other such embodiments, the encapsulant material of the first, second, third, and fourth light emitter zones are configured such that each of the first, second, third, and fourth light emitter zones emit a different temperature white light. In such embodiments, the light emitter device may emit white light within a range of color temperatures, including cool white, warm white, and true white.

In some embodiments, the plurality of traces include at least first, second, third, fourth, and fifth electrically conductive traces; the plurality of light emitter zones include at least first, second, third, fourth, and fifth light emitter zones; each of the first, second, third, fourth, and fifth light emitter zones include a different encapsulant material from each other; and the one or more LEDs in each of first, second, third, fourth, and fifth light emitter zones are individually addressable to produce a plurality of different light outputs. In some such embodiments, the encapsulant material of the first, second, third, and fourth light emitter zones are configured such that the first light emitter zone emits a red light, the second light emitter zone emits a green light, the third light emitter zone emits a blue light, the fourth light emitter zone emits a yellow light, and the fifth light emitter zone emits a white light. In other such embodiments, the encapsulant material of the first, second, third, fourth, and fifth light emitter zones are configured such that each of the first, second, third, fourth, and fifth light emitter zones emit a different temperature white light. In such embodiments, the light emitter device may be configured to emit white light within a range of color temperatures, including cool white, warm white, and true white.

In still another embodiment, a method of controlling a light output from light emitter device is provided, the light emitter device having a submount comprising a top surface and a bottom surface; a first set of electrically conductive traces on the top surface of the submount; a first plurality of light emitting diodes (LEDs) arranged on the top surface of the submount in a first light emitter zone, wherein the first plurality of LEDs is electrically connected to the first set of traces; a second set of electrically conductive traces on the top surface of the submount; a second plurality of LEDs arranged on the top surface of the submount in a second light emitter zone, wherein the second plurality of LEDs is electrically connected to the second set of traces; a retention material disposed over the top surface of the submount in a form of a plurality of walls, the plurality of walls separating the first and second light emitter zones between respective walls of the retention material; a first encapsulant disposed in the first light emitter zone; and a second encapsulant disposed in the second light emitter zone; the first and second plurality of LEDs being individually addressable. According to this embodiment, the method includes the steps of individually controlling an output of light from each of the plurality of light emitter zones to produce a plurality of different light outputs from the light emitter device.

While the subject matter has been described herein with reference to specific aspects, features, and illustrative embodiments, it will be appreciated that the utility of the subject matter is not thus limited, but rather extends to and encompasses numerous other variations, modifications, and alternative embodiments, as will suggest themselves to those of ordinary skill in the field of the present subject matter, based on the disclosure herein.

Aspects disclosed herein can, for example, and without limitation, provide one or more of the following beneficial technical effects: reduced cost of providing solid state lighting apparatuses; reduced size, volume, or footprint of solid state lighting apparatuses; improved efficiency; improved color rendering; improved thermal management; simplified circuitry; improved contrast, improved viewing angle; improved color mixing; improved reliability; and/or simplified DC or AC operability.

Various combinations and sub-combinations of the structures and features described herein are contemplated and will be apparent to a skilled person having knowledge of this disclosure. Any of the various features and elements as disclosed herein can be combined with one or more other disclosed features and elements unless indicated to the contrary herein. Correspondingly, the subject matter as hereinafter claimed is intended to be broadly construed and interpreted, as including all such variations, modifications, and alternative embodiments, within its scope and including equivalents of the claimed features.

What is claimed is:

1. A light emitter device comprising:
   a submount comprising a top surface and a bottom surface;
   a first set of electrically conductive traces on the top surface of the submount;
   a first plurality of light emitting diodes (LEDs) arranged on the top surface of the submount in a first light emitter zone, wherein the first plurality of LEDs is electrically connected to the first set of electrically conductive traces;
   a second set of electrically conductive traces on the top surface of the submount;
   a second plurality of LEDs arranged on the top surface of the submount in a second light emitter zone, wherein the second plurality of LEDs is electrically connected to the second set of electrically conductive traces;
   a retention material disposed over the top surface of the submount in a form of a plurality of walls, the plurality of walls separating the first and second light emitter zones between respective walls of the retention material;
   a first encapsulant disposed in the first light emitter zone;
   a second encapsulant, which comprises a different encapsulant material from the first encapsulant, disposed in the second light emitter zone;
   a third set of electrically conductive traces on the top surface of the submount;
   at least one LED arranged on the top surface of the submount in a third light emitter zone, wherein the at least one LED is electrically connected to the third set of electrically conductive traces; and
   a third encapsulant dispensed in the third light emitter zone,
   wherein the at least one LED is different from the first and second pluralities of LEDs,
   wherein the first plurality of LEDs, the second plurality of LEDs, and the at least one LED are individually addressable, and
   wherein the first and second light emitter zones are arranged circumferentially around a perimeter of the third light emitter zone, such that the second light emitter zone circumferentially surrounds the third light emitter zone and is circumferentially surrounded by the first light emitter zone.

2. The device of claim 1, wherein the retention material and the first and second encapsulants are configured to be dispensed as respective viscous materials.

3. The device of claim 1, comprising a plurality of electrically conductive pads on the bottom surface of the submount, wherein each trace of the first and second set of electrically conductive traces are in electrical communication with one or more of the plurality of pads with respective vias formed in the submount.

4. The device of claim 3, wherein one of the first set of electrically conductive traces is connected to a different pad of the plurality of pads than one of the second set of electrically conductive traces, and wherein another of the first set of electrically conductive traces and another of the second set of electrically conductive traces are both respectively connected to a same pad of the plurality of pads.

5. The device of claim 1, wherein walls of the retention material adjacent to the first light emitter zone are higher than a height of the first plurality of LEDs and wherein walls of the retention material adjacent to the second light emitter zone are higher than a height of the second plurality of LEDs.

6. The device of claim 3, wherein the first encapsulant and the second encapsulant have a height that is less than or equal to a height of the walls adjacent to the first and second light emitter zones, respectively, to physically separate the first and second encapsulants from each other.

7. The device of claim 1, wherein the walls of the retention material are configured to reflect light.

8. The device of claim 1, wherein the walls of the retention material are configured to absorb light.

9. The device of claim 1, wherein the first encapsulant and the second encapsulant comprise a same encapsulant material.

10. The device of claim 1, wherein the device is configured to output high color rendering index light, and/or a white light, from cool white to warm white.

11. The device of claim 1, wherein the first and/or second plurality of LEDs are connected in a plurality of strings of serially connected LEDs, the strings of LEDs being connected in parallel relative to each other.

12. The device of claim 1, wherein one or more of the first or second pluralities of LEDs are electrically connected with wirebonds.

13. The device of claim 12, wherein at least some of the wirebonds are formed so as to be at least partially internal to the retention material.

14. The device of claim 1, wherein one or more of the first or second plurality of LEDs are electrically connected by direct attachment thereof to a respective bonding pad on a surface of the submount.

15. The device of claim 1, wherein substantially all of the upper surface of the submount is covered by the retention material and encapsulant materials.

16. The device of claim 1, wherein the third set of electrically conductive traces are electrically isolated from the first and second sets of electrically conductive traces.

17. The device of claim 1, wherein the third light emitter zone is arranged on the submount such that the first and second light emitter zones are arranged outside of a perimeter of the third emitter zone.

18. A light emitter device comprising:
a submount comprising a top surface and a bottom surface;
a first set of electrically conductive traces on the top surface of the submount;
a first plurality of light emitting diodes (LEDs) arranged on the top surface of the submount in a first light emitter zone, wherein the first plurality of LEDs is electrically connected to the first set of electrically conductive traces;
a second set of electrically conductive traces on the top surface of the submount;
a second plurality of LEDs arranged on the top surface of the submount in a second light emitter zone, wherein the second plurality of LEDs is electrically connected to the second set of electrically conductive traces;
a retention material disposed over the top surface of the submount in a form of a plurality of walls, the plurality of walls separating the first and second light emitter zones between respective walls of the retention material;
a first encapsulant disposed in the first light emitter zone;
a second encapsulant disposed in the second light emitter zone;
a third set of electrically conductive traces on the top surface of the submount;
at least one LED arranged on the top surface of the submount in a third light emitter zone, wherein the at least one LED is electrically connected to the third set of electrically conductive traces;
a third encapsulant dispensed in the third light emitter zone,
a fourth set of electrically conductive traces on the top surface of the submount;
a fourth plurality of LEDs arranged on the top surface of the submount in a fourth light emitter zone; and
a fourth encapsulant dispensed in the fourth light emitter zone;
wherein the first plurality of LEDs, the second plurality of LEDs, and the at least one LED are individually addressable,
wherein the first and second light emitter zones are arranged circumferentially around a perimeter of the third light emitter zone, such that the second light emitter zone circumferentially surrounds the third light emitter zone and is circumferentially surrounded by the first light emitter zone; and wherein each of the first, second, third, and fourth encapsulants comprise different encapsulant materials.

19. The device of claim 18, wherein each of the first, second, and fourth pluralities of LEDs, as well as the at least one LED, are individually addressable.

20. The device of claim 18, wherein each of the first, second, third, and fourth encapsulants are a same encapsulant material.

21. The device of claim 18, wherein:
the first encapsulant is configured such that the first light emitter zone outputs a red light;
the second encapsulant is configured such that the second light emitter zone outputs a green light;
the third encapsulant is configured such that the third light emitter zone outputs a white light; and
the fourth encapsulant is configured such that the fourth light emitter zone outputs a blue light.

22. The device of claim 18, wherein the first, second, third, and fourth encapsulants are respectively configured such that the device outputs a range of white temperatures between cool white and warm white, including true white.

23. The device of claim 18, wherein the first, second, and fourth light emitter zones are arranged in concentric ring shapes surrounding the third light emitter zone, and wherein adjacent light emitter zones are separated from each other by walls formed from the retention material.

24. The device of claim 23, wherein the first, second, and fourth light emitter zones each comprise a plurality of strings of serially-connected LEDs that are formed from the respective first, second, and fourth pluralities of LEDs.

25. The device of claim 18, comprising a plurality of electrically conductive pads on the bottom surface of the submount, wherein each trace of the first, second, third, and fourth set of electrically conductive traces are in electrical communication with one or more of the plurality of pads by respective vias formed in the submount.

26. The device of claim 25, wherein one of each of the first, second, third, and fourth set of electrically conductive traces are connected to a different pad of the plurality of pads, wherein another of the first set of electrically conductive traces, another of the second set of electrically conductive traces, and another of the fourth set of electrically conductive traces are all, respectively, connected to a same pad of the plurality of pads, and wherein another of the third set of electrically conductive traces is connected to still another of the plurality of pads.

27. The device of claim 26, wherein the first, second, third, and fourth light emitting zones together form a shape, such that each of the first, second, third, and fourth light emitting zones occupies substantially a quadrant of the shape.

28. The device of claim 27, wherein the quadrants of the shape are separated from adjacent quadrants by walls formed by the retention material.

29. The device of claim 18, comprising:
a fifth set of electrically conductive traces on the top surface of the submount;
a fifth plurality of LEDs arranged on the top surface of the submount in a fifth light emitter zone; and
a fifth encapsulant dispensed in the fourth light emitter zone,
wherein the first, second, fourth, and fifth pluralities of LEDs and the at least one LED of the third light emitter zone are each individually addressable.

30. The device of claim 29, wherein the light emitter device is configured to independently control an output of light from the first, second, third, fourth, and fifth light emitter zones to produce a specified light output.

31. The device of claim 30, wherein the specified light output is a white light ranging from cool white to warm white or a colored light.

32. The device of claim 31, wherein the white light is a true white with a high color rendering index.

33. The device of claim 18, wherein the at least one LED is different from the first and second pluralities of LEDs.

34. A light emitter device comprising:
a submount comprising a top surface and a bottom surface;
a first set of electrically conductive traces on the top surface of the submount;
one or more first light emitting diodes (LEDs) arranged on the top surface of the submount in a first light emitter zone, wherein the one or more first LEDs are surface mount devices (SMD) that are electrically connected to the first set of electrically conductive traces by electrically conductive pads on a bottom surface of the one or more first LEDs;
a second set of electrically conductive traces on the top surface of the submount;
one or more second LEDs arranged on the top surface of the submount in a second light emitter zone, wherein the one or more second LEDs have electrically conductive pads on a top surface thereof and are electrically connected to the second set of electrically conductive traces by wirebonds;
a retention material disposed over the top surface of the submount in a form of a plurality of walls, the plurality of walls separating the one or more first LEDs from the one or more second LEDs between respective walls of the retention material to define respective first and second light emitter zones;
a first encapsulant disposed over the one or more first LEDs in the first light emitter zone; and
a second encapsulant disposed over the one or more second LEDs in the second light emitter zone;
wherein the first encapsulant is different from the second encapsulant, such that a light output from the first light emitter zone is different from a light output from the second light emitter zone;
wherein a light output intensity of the first and second light emitter zones is individually controllable, such that the light emitter device is configured to emit a plurality of different colors of light output; and
wherein the first and second plurality of LEDs are individually addressable.

* * * * *